US008697554B2

(12) United States Patent
Tennant et al.

(10) Patent No.: US 8,697,554 B2
(45) Date of Patent: Apr. 15, 2014

(54) LATERAL COLLECTION ARCHITECTURE FOR SLS DETECTORS

(75) Inventors: William E. Tennant, Thousand Oaks, CA (US); Gerard J. Sullivan, Newbury Park, CA (US); Mark Field, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 127 days.

(21) Appl. No.: 13/205,403

(22) Filed: Aug. 8, 2011

(65) Prior Publication Data

US 2011/0294252 A1  Dec. 1, 2011

Related U.S. Application Data

(62) Division of application No. 12/476,226, filed on Jun. 1, 2009, now Pat. No. 8,178,863.

(51) Int. Cl.
  *H01L 21/425* (2006.01)
(52) U.S. Cl.
  USPC ............................ 438/514; 438/369; 438/506
(58) Field of Classification Search
  None
  See application file for complete search history.

(56) References Cited

U.S. PATENT DOCUMENTS

| | | | |
|---|---|---|---|
| 5,880,510 A * | 3/1999 | Cockrum et al. | ............. 257/442 |
| 7,034,331 B2 | 4/2006 | Chang et al. | |
| 7,755,079 B2 * | 7/2010 | Kim et al. | ........................ 257/18 |
| 2009/0045395 A1 | 2/2009 | Kim et al. | |

* cited by examiner

*Primary Examiner* — Tan N Tran
*Assistant Examiner* — Scott R Wilson
(74) *Attorney, Agent, or Firm* — Snell & Wilmer LLP

(57) ABSTRACT

Lateral collection architecture for a photodetector is achieved by depositing electrically conducting SLS layers onto a planar substrate and diffusing dopants of a carrier type opposite that of the layers through the layers at selected regions to disorder the superlattice and create diode junctions oriented transversely to the naturally enhanced lateral mobility of photogenerated charge carriers within the superlattice. The diode junctions are terminated at a top surface of the photodetector within an SLS layer of wide bandgap material to minimize unwanted currents. A related architecture disorders the superlattice of topmost SLS layers by diffusing therethrough a dopant configured as a grid and penetrating to a lower SLS layer having the same carrier type as the dopant and opposite that of the topmost layers to isolate pixels within the topmost layers. Ohmic contacts may be deposited on doped regions, pixels, and substrate to provide desired external connections.

19 Claims, 22 Drawing Sheets

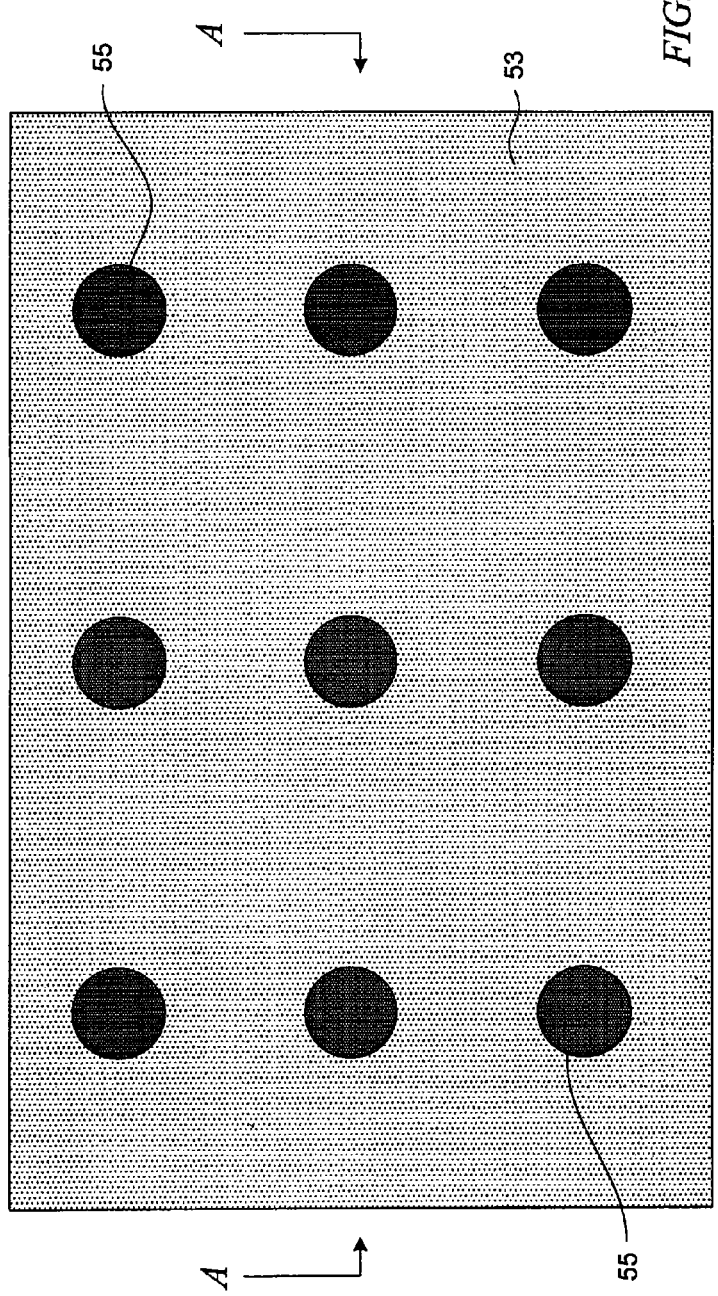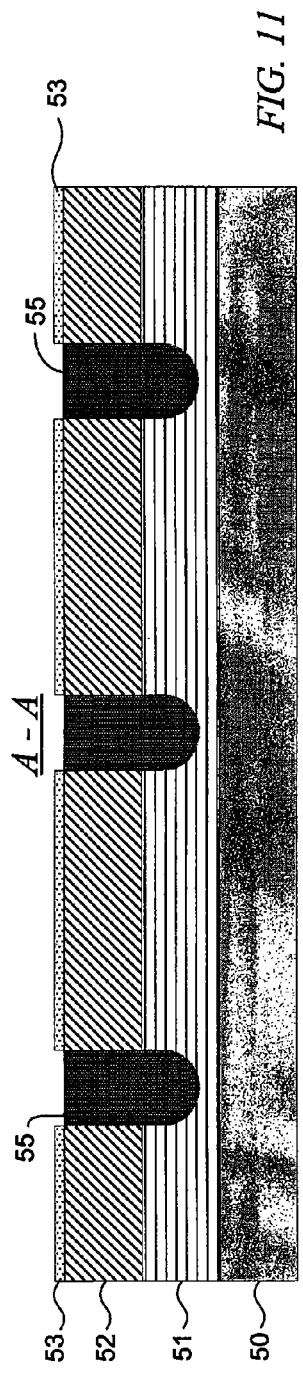

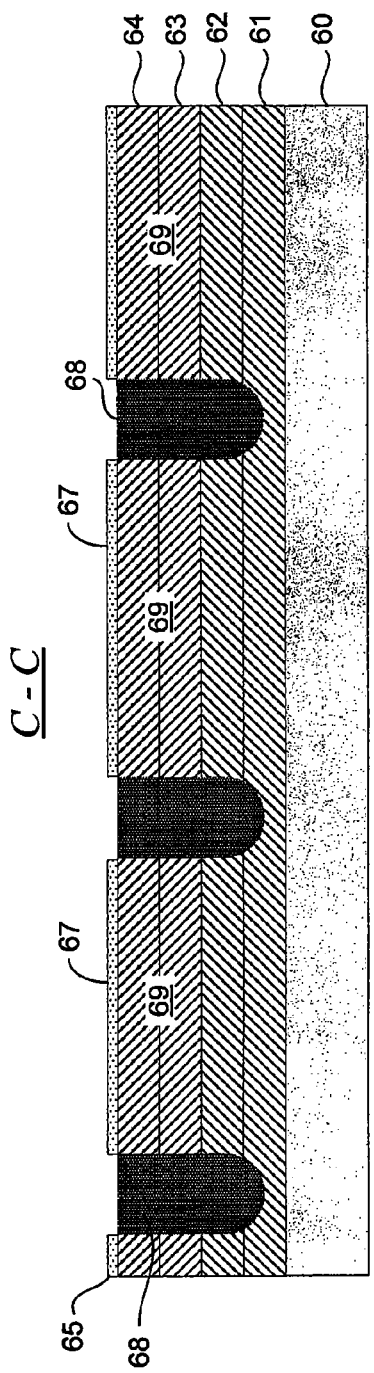
FIG. 22 C-C
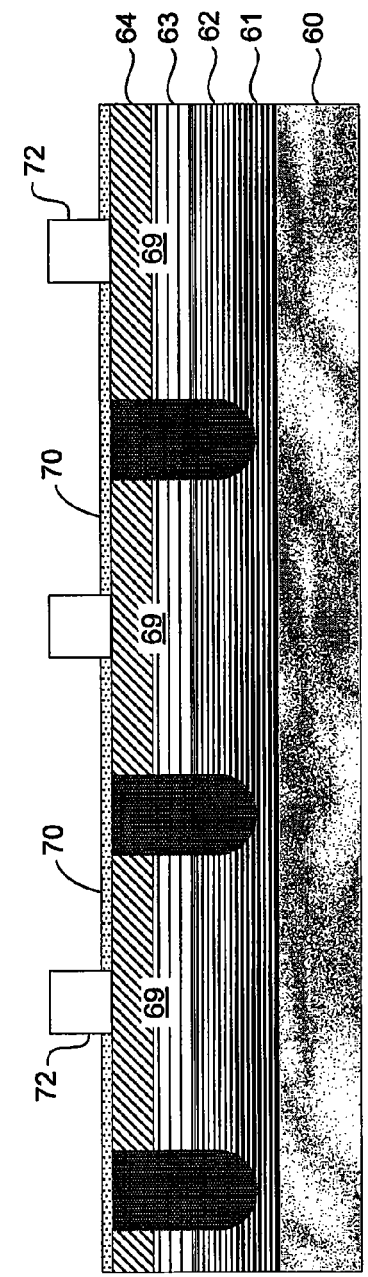
FIG. 24 D-D

US 8,697,554 B2

LATERAL COLLECTION ARCHITECTURE FOR SLS DETECTORS

CLAIM OF PRIORITY UNDER 35 U.S.C. §120

This application is a divisional of U.S. application Ser. No. 12/476,226, entitled "LATERAL COLLECTION ARCHITECTURE FOR SLS DETECTORS," filed on Jun. 1, 2009, now U.S. Pat. No. 8,178,863, which is assigned to the assignee hereof and hereby expressly incorporated by reference herein.

BACKGROUND

1. Field

The present invention relates generally to infrared photodetectors. More specifically the invention relates to photodiodes of infrared detectors formed from diffusing n-type or p-type dopants into a strained layer superlattice structure to promote lateral collection of charge carriers.

2. Description of Related Art

Strained Layer Superlattice (SLS) structures have many applications in semiconductor technologies. In particular, SLS structures can function effectively as photodetectors over a wide range of wavelengths. Certain characteristics of SLS structures make them an attractive choice for photodetection. These characteristics include their relatively low Auger recombination for a given doping level, their substantially uniform properties in very long wavelength applications, and the design freedom they allow for selecting a cutoff wavelength. For these reasons, SLS structures are currently being developed for long to very long wavelength infrared (IR) detection.

In IR detector applications, SLS structures are band-gap engineered semiconductors. They are typically made by alternating thin indium-arsenide (InAs) layers with thin gallium-indium-antimonide (GaInSb) layers to form a layered structure. The quantum confinement, strain, and unusual band lineup create an anisotropic IR absorbing material from which photodiodes can be made. The photodiodes are formed by doping a region near the top surface n-type layer, etching mesas into the structure, and passivating the mesas with a coating of nitride or with a wide band-gap group III-V semiconductor.

FIG. 1 shows the architecture for a typical InAs—GaSb SLS photodetector diode, or photodiode 10. This type of photodetector can be produced with a superlattice bandgap having a cutoff wavelength that can be tuned across the infrared bands. The photodiode 10 is fabricated as a series of layers formed on a substrate in such a way to assume the general appearance of a mesa structure. The substrate, in this example, is a p-type GaSb substrate 11. A p-type GaSb buffer layer 13 is formed on the substrate 11. From bottom to top, the series of layers are: (i) a p-type SLS structure 15, (ii) an undoped SLS structure 17, (iii) an n-type SLS structure 19, and (iv) an n-type InAs layer 21. The standard photodiode fabrication procedure is to form the mesas by etching the layers to isolate the devices. The mesa of photodiode 10 is then passivated along its sidewalls with a passivation layer 23. Connection points are provided by a top Ohmic material 25 and a bottom Ohmic material 27, as shown.

The foregoing photodiode architecture suffers from a number of problems. Notably, the exposed sidewalls of the mesa (29) can be a source of undesirable excess currents that degrade the performance of the photodiode 11. In addition, the passivation process itself can be inherently difficult for an SLS detector, especially for detectors that have bare surface mesa geometries. To date, sidewall passivation techniques have not been completely effective.

Aside from the passivation layer, SLS detectors have other characteristics that inhibit the design of practical detector architecture. One problem is that SLS detectors can exhibit poor quantum efficiency (QE), i.e. the fraction of incident photons registered by the detector. This is mainly the result of poor minority carrier mobility perpendicular to the plane of the superlattice and short minority carrier lifetime. Another problem is that SLS detectors can exhibit undesirable variations in dark current and shunting effects. These variations are presumed to occur as a result of defects in the crystalline structure at the surface of the diode junction where the bandgap tends to be narrowest.

SUMMARY

The present invention provides a planar architecture for a photodetector having one or more photodiode junctions oriented transversely within an SLS structure to promote lateral collection of photogenerated charge carriers. The photodiode junctions are formed in selected regions by diffusing a dopant that changes the carrier type of the superlattice in the selected regions. The transverse orientation of the photodiode junctions exploits the naturally enhanced lateral mobility of carriers in an SLS to achieve higher fill factor. Passivation requirements are eliminated by eliminating the sidewall and by terminating the metallurgical diode junctions at the top surface of the photodetector within wide bandgap material which is relatively resistant to dark current generation. As a result, the invention achieves an increase in the ratio of photocurrent to dark current, and higher quantum efficiencies. The diffusion process may also homogenize the superlattice in the region of the diffusion widening the band gap and further reducing dark currents from that region. For appropriate shallow-depth structures, where the needed junction depth is on the order of 1.5 microns or less, implantation may substitute for diffusion. In this situation, the heavy doping of the implanted region would reduce minority carrier concentration to offset the effects of implant-induced damage to avoid increasing dark current.

A planar architecture for a photodiode array configured for lateral collection includes a planar substrate, a first electrically conducting layer deposited on the substrate, the first electrically conducting layer having a single carrier type, a second electrically conducting layer deposited on the first electrically conducting layer and forming a top surface of the planar photodiode array, the second electrically conducting layer having the same carrier type as the first electrically conducting layer, and having a wider bandgap than the first electrically conducting material to form a conducting layer stack. The first and second layers are SLS structures. A plurality of regions of electrically conducting dopants are arranged throughout the top surface of the conducting layer stack to form a photodiode array, the regions having a single carrier type of a type opposite the first electrically conducting layer stack, each region penetrating the first and second electrically conducting layers of the stack and isolated from all other regions within the first and second electrically conducting layers, thereby forming transversely oriented diode junctions. A plurality of first Ohmic contacts are formed on the top surface of each diffused region, and each first Ohmic contact electrically coupled to one of the diffused regions at the top surface of the planar photodiode. A second common Ohmic contact is electrically coupled to the conducting layer stack in the undiffused region. The second Ohmic contact may be made to the substrate if it is suitably conducting with an Ohmic interface to the conducting layer stack.

A related embodiment of a planar photodetector includes a planar substrate, a first electrically conducting layer deposited on the substrate, the first electrically conducting layer having a single carrier type, a second electrically conducting layer deposited on the first electrically conducting layer, the second electrically conducting layer having the same carrier type as the first layer, a third electrically conducting layer deposited on the second electrically conducting layer, the third layer having a single carrier type of a type opposite the first layer, and a fourth electrically conducting layer deposited on the third electrically conducting layer and forming a top surface of the photodetector, the fourth electrically conducting layer having the same carrier type as the third electrically conducting layer. The first, second, third, and fourth layers may be SLS structures, and the fourth layer may be a wide bandgap material. A grid of an electrically conducting dopant is formed through the top surface, the grid having the same carrier type as the first electrically conducting layer and penetrating to the second electrically conducting layer to define a plurality of pixels, each pixel formed from the third and fourth electrically conducting layers and isolated from all other pixels by the grid and by the second electrically conducting layer, each pixel forming lateral collection diode junctions between each pixel and the grid. A plurality of first Ohmic contacts are provided, each first Ohmic contact electrically coupled to one of the pixels at the top surface of the planar photodiode, and a second common Ohmic contact is electrically coupled to the planar substrate.

A method for fabricating a photodetector having lateral collection architecture includes providing a substrate suitable for depositing thereon one or more photosensitive quantum confined layers or structures, depositing on the substrate a first electrically conducting layer having a single carrier type, depositing on the first electrically conducting layer a second electrically conducting layer of a photosensitive quantum confined detector material having the same carrier type as the first layer, masking the second layer to locate unmasked regions for conversion, converting the unmasked regions to doped regions having a carrier type opposite that of the first and second layers, masking the doped regions to define locations for deposition of first Ohmic contacts on each of the doped regions, depositing the first Ohmic contacts on the locations defined in the previous step, and providing electrical connections to the doped regions via the first Ohmic contacts, and to the first or second layer outside the doped regions via a second Ohmic contact. The term "quantum confined" includes strained-layer superlattice, quantum dots, etc. In an alternative embodiment, doped regions may be replaced with disordered regions.

A related method for fabricating a photodetector or photodetector array according to the invention includes the steps of providing a substrate suitable for depositing thereon one or more photosensitive layer structures, depositing on the substrate a first electrically conducting layer having a single carrier type, depositing a second electrically conducting layer of a photosensitive quantum confined detector material, the layer having the same carrier type as the first layer, depositing a third electrically conducting layer of a photosensitive quantum confined detector material, the layer having a single carrier type of a type opposite the second layer and the same bandgap as the second layer, depositing a fourth electrically conducting layer having a wider bandgap than the second and third electrically conducting layers and having a same carrier type as the third layer, masking the fourth layer to locate pixels between unmasked regions, converting unmasked regions to doped regions, each doped region having the carrier type of the first and second layers to a depth penetrating to the second layer, masking the fourth layer to define locations for deposition of first Ohmic contacts on each of the pixels, depositing the first Ohmic contacts on surfaces of the pixels, and providing electrical connections to the first Ohmic contacts, and to the first or second layer via a second Ohmic contact. A passivation layer can be deposited either before or after deposition of the first Ohmic contacts on each of the pixels. In one embodiment, the first electrically conducting layer has a wider band gap than the quantum confined layer. The first electrically conducting layer may have a graded band gap to reduce the drawbacks of interfaces. Also, the first electrically conducting layer may be optional as the substrate may provide the advantages such as a suitable crystal quality and a low generation interface to the active quantum confined layer. For this structure and the structure described above in the first paragraph of the Summary section with respect to the planar architecture for the photodetector having the one or more photodiode junctions oriented transversely within the SLS structure, the unmasked regions which are converted to doped regions may first be etched to some depth through the stacked structure so that the doping procedure does not have to penetrate as deeply from the surface into the structure to effect doping of lower layers in the structure.

Aspects of the invention may also be used on mesa structures to provide a cap-doped photodiode array. Such a device may include a planar substrate, a first electrically conducting layer deposited on the substrate, the first electrically conducting layer having a single carrier type, a second electrically conducting layer deposited on the first electrically conducting layer and forming a top surface of the planar photodiode array, the second electrically conducting layer having the same carrier type as the first electrically conducting layer, and having a narrower bandgap than the first electrically conducting material to form a conducting layer stack, a plurality of mesas of electrically conducting material arranged on top of the substrate and formed in the conducting layer stack, each mesa having a top surface and a sidewall, the electrically conducting material having a single carrier type, each mesa being implanted or diffused along its top surface and along at least a part of its sidewall (preferably as far down as the first electrically conducting layer) with a carrier type opposite that of the electrically conducting layer stack, a plurality of Ohmic contacts, each Ohmic contact electrically coupled to a top surface of a mesa, a second Ohmic contact to the planar substrate or first layer, and electrical connections coupled to the Ohmic contacts and to the planar substrate. The first and second layers may be photosensitive quantum confined detector material structures.

A related method for fabricating a cap-doped photodetector pixel array having a wide bandgap passivation layer includes steps of providing a substrate suitable for depositing a photosensitive layer structure thereon, depositing a first electrically conducting layer on the substrate, the first electrically conducting layer having a single carrier type, depositing a second electrically conducting layer on the first electrically conducting layer and forming a top surface of the planar photodiode array, the second electrically conducting layer having the same carrier type as the first electrically conducting layer, and having a narrower bandgap than the first electrically conducting material to form a conducting layer stack, arranging a plurality of mesas of electrically conducting material on top of the substrate and formed in the conducting layer stack, each mesa having a top surface and a sidewall, the electrically conducting material having a single carrier type, implanting or diffusing each mesa along its top surface and along at least a part of its sidewall (preferably as far down as the first electrically conducting layer) with a carrier type opposite that of the electrically conducting layer stack, providing a plurality of Ohmic contacts, each Ohmic contact electrically coupled to a top surface of a mesa, electrically coupling a second Ohmic contact to the planar substrate or first layer, and providing electrical connections to the Ohmic contacts and to the planar substrate. The first and second layers may be SLS structures.

BRIEF DESCRIPTION OF THE DRAWINGS

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. Component parts shown in the drawings are not necessarily to scale, and may be exaggerated to better illustrate the important features of the invention. In the drawings, like reference numerals designate like parts throughout the different views, wherein:

FIG. 10 is a top view of the SLS photodetector of FIG. 9 illustrating diffusion of a single carrier type material into the unmasked regions.

FIG. 11 is a cross-sectional view of the SLS photodetector of FIG. 10 taken along section A-A.

FIG. 22 is a cross-sectional view of the SLS photodetector of FIG. 21 taken along section C-C.

FIG. 24 is a cross-sectional view of the SLS photodetector of FIG. 21 taken along section D-D after depositing Ohmic contacts on the unmasked regions.

DETAILED DESCRIPTION

This disclosure presents exemplary embodiments of the invention of lateral collection architecture for quantum confined diode structures (e.g., SLS photodetectors, layers or structures, quantum dots, etc.). This architecture has particular application for fabricating photodiode arrays and provides a superior alternative to conventional mesa-etched designs. The invention introduces the concept of forming planar photodiodes from SLS structures of a single carrier type (n or p) by diffusing or implanting dopants of opposite carrier type within the SLS structure in a direction transverse to the superlattice layers. This creates diode junctions that terminate in wide bandgap material, and permits the diodes to collect photogenerated carriers that diffuse laterally (as well as vertically or transversely) through the superlattice. In addition, for each diode so formed, the junction area for a given optical area can be smaller than that provided in a conventional mesa structure, resulting in diminished generation of junction-related dark currents. Photodetectors fabricated according to the present invention avoid the sidewall passivation problems of mesa architecture, generate lower levels of unwanted currents, and improve quantum efficiency when compared to the prior art.

Figure 1:
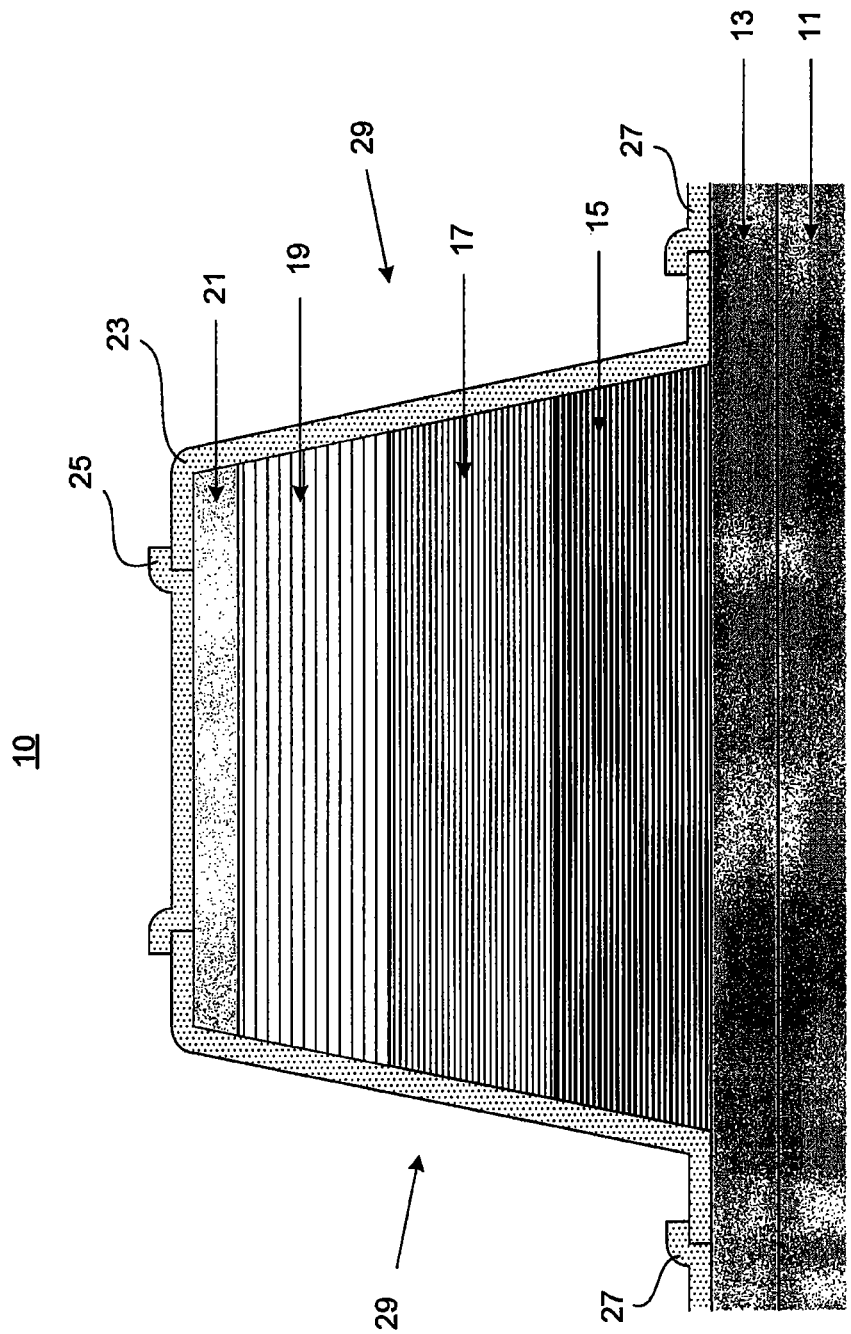
FIG. 1 is a cross sectional view of the mesa structure of a prior art SLS photodiode.
Figure 2:
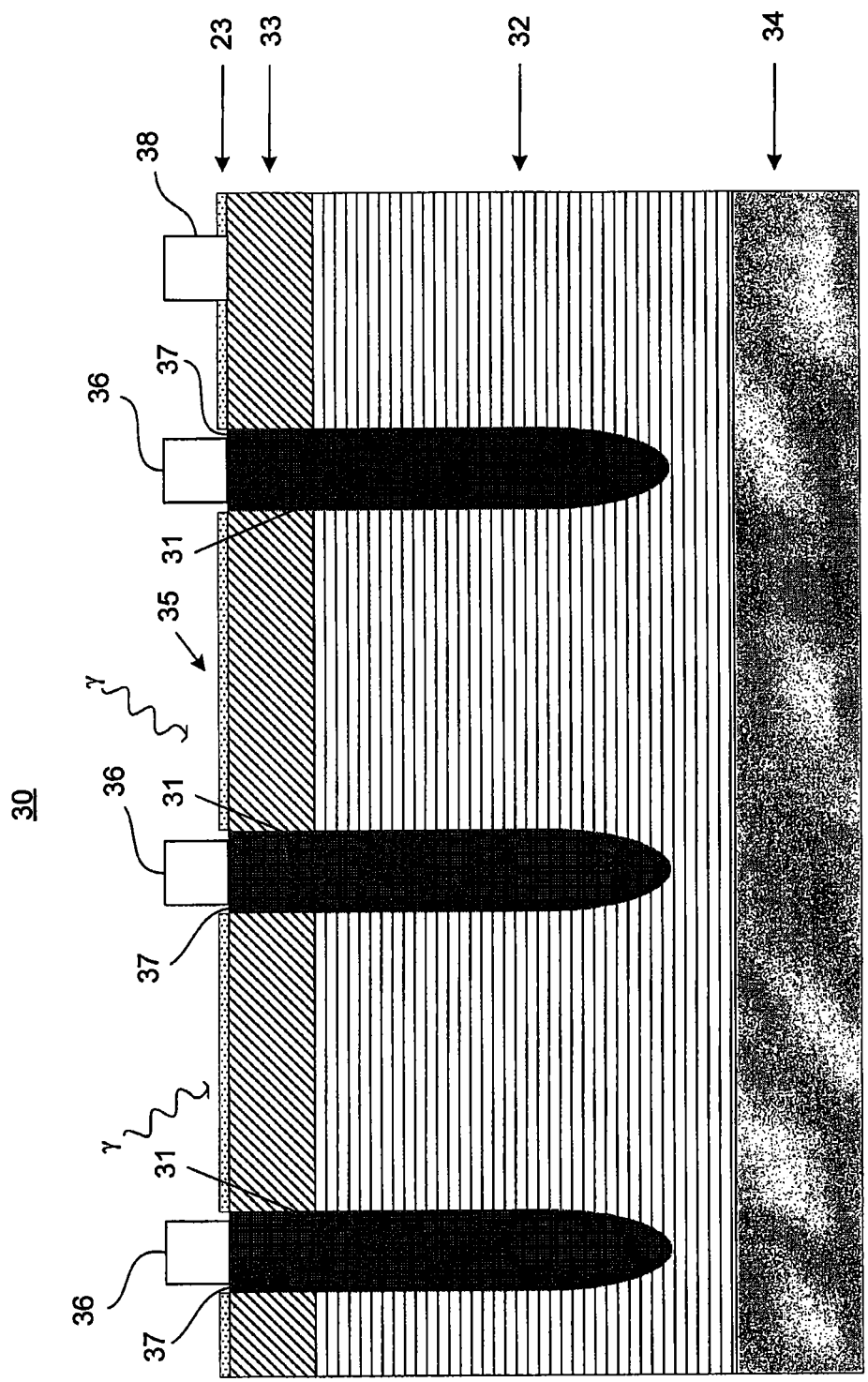
FIG. 2 is a cross sectional view of a p-on-n photodetector array having photodiodes formed by p-type diffusion within n-type SLS structures according to one embodiment the invention.

FIG. 2 shows a cross sectional view of a portion of a photodetector 30 according to one embodiment of the invention. FIG. 2 can include the additional layers or structures shown in FIG. 4. Photodetector 20 is a p-on-n detector having an array of photodiodes formed by diffusing p-type material within n-type SLS structures 32 and 33. Structure 33 can be a wide band gap conventional semiconductor as long as the band alignment creates a barrier to minority carrier propagation. The diffusion creates a wide bandgap p-doped alloy region 31 that forms a heterojunction diode within structures 32 and 33. For infrared detection, the p-type regions 31 that form the array may be spaced apart by distances on the order of a few microns to a few tens of microns. The depth of each p-type region is exaggerated for purposes of illustration, and in reality may be only a few microns deep. Other configurations and spacings are possible within the scope of the invention, and may be selected according to the wavelength or range of wavelengths to be detected. The thickness of SLS structures 32 and 33 may be on the order of one micron to tens of microns thick. Each lattice or sublayer within an SLS structure is between about 10 angstroms and about 50 angstroms, with hundreds of layers making up an SLS structure, the exact number of layers depending on the desired thickness, selected layer composition, and detection wavelength of interest, as is known to those skilled in the art. Within each SLS structure, each sublayer is confined by other sublayers to limit the flow of minority carriers.

In photodetector 30, SLS structures 32 and 33 may be any n-type SLS structure such as indium arsenide, gallium arsenide, a combination of these, or another known structures having similar SLS properties and n-type carriers. SLS structure 32 may be a doped n-type structure, and SLS structure 33 may be composed of a material that has a wider bandgap than SLS structure 32 for improved passivation at the surface of the photodetector. The SLS structures 32 and 33 are deposited onto a planar substrate 34, which provides a common electrical contact for photodetector 30.

Each volume or region of p-type alloy 31 is formed within the layers of the SLS structures 32 and 33 by a doping technique such as diffusion or ion implantation. In one embodiment, p-type regions 31 may be formed by diffusing zinc. Preferably, the diffused p-type regions 31 may form a wide bandgap quaternary material by enhancing interdiffusion of the quantum confined material. The resulting photodiode structure provides a plurality of regions 31 of electrically conducting material having a carrier type of a type opposite SLS structures 32 and 33. Each region 31 penetrates SLS structures 32 and 33, forming p-n junctions therewith, and each region is isolated from all other regions 31 within the SLS structures.

Photons (γ) incident on the top surface 35 or through the substrate 34 of photodiode 30 having sufficient energy will generate minority carriers (i.e. electrons) within the SLS structures. The photogenerated carriers will diffuse laterally within the SLS structure more easily than vertically, therefore a greater percentage of the carriers will migrate toward, and be collected by, the diffused p-type regions 31 before they can recombine. Generally, this provides a photodetector with a higher quantum efficiency than would be possible using diode junctions that collect carriers moving vertically through the superlattice.

Ohmic contacts 36 may be deposited on each of the diffused p-type regions 31. The Ohmic contacts provide a convenient connection point for coupling the photodiodes to external sensing circuitry. A voltage signal generated by collection of charge carriers at any particular region 31 may be sensed by the potential difference between an Ohmic contact 36 and the common contact 38 (see FIG. 2).

As described above, in one embodiment of a photodetector 30, SLS structure 33 may be formed from a material having a wider bandgap than SLS structure 32. This architecture, combined with vertically oriented p-type regions 31, places the exposed part of the p-n junction within the wide bandgap material at location 37. Shunt currents and other leakage currents that would undesirably occur at the exposed junction of a conventional mesa structure (i.e. the sidewall) are greatly diminished by the design of the present invention because carriers generated in or near location 37 will be made relatively insignificant by the wide bandgap in structure 33. Structure 33 may be a wide bandgap SLS or a wide bandgap conventional semiconductor. The invention advantageously avoids the provision of a passivation layer for the sidewall by eliminating the termination of p-n junctions within small bandgap material. As a result, surface currents and tunneling effects are also greatly reduced.

An environmental encapsulant 23 may be deposited over the SLS structure 33. The environmental encapsulant 23 is typically an insulator with adequate dielectric and mechanical strength to protect the photodetector 30 from electrically and/or chemically active contamination. Examples of the environmental encapsulant 23 include polyimide, $SiO_2$, $Si_3N_4$, and comparable semiconductor materials.

Figure 3:
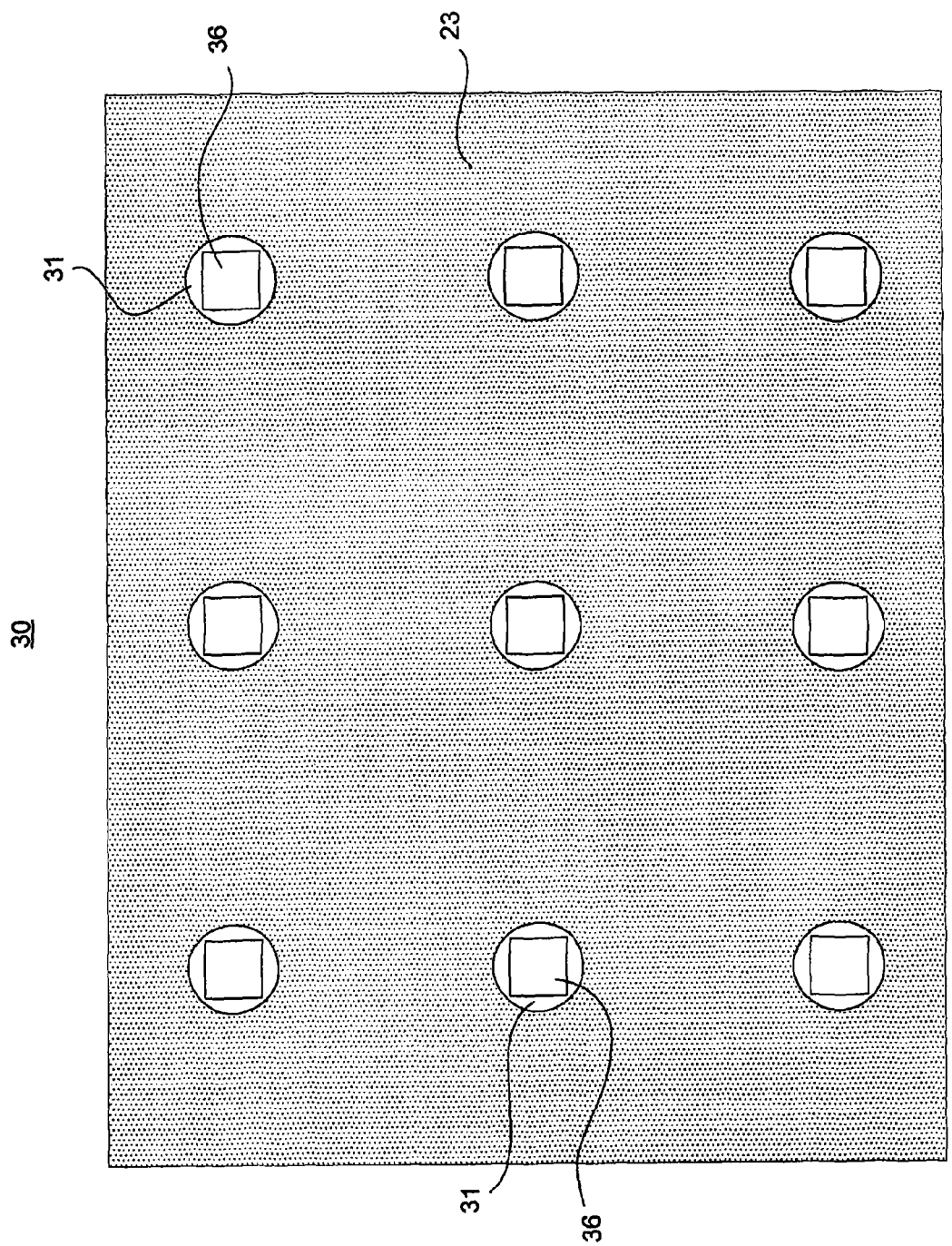
FIG. 3 is a top view of the photodetector array of FIG. 2.

FIG. 3 shows a top view of photodetector array 30. In this view, each diffused p-type region 31 is shown partially exposed at the top surface of the photodetector, and the regions 31 are shown arranged in regularly spaced intervals. Other embodiments are possible having irregular arrays or other variations in spacing or exposure of the diffused region. The SLS structure 33 (and the structure below it), which may be composed of an n-type material, isolates each of the regions 31 to form an array of heterojunction diodes oriented transversely with respect to the layers of SLS structures 32 and 33.

In another embodiment according to the invention, an n-on-p photodetector may be configured as shown in FIGS. 2 and 3, where the SLS structures 32 and 33 comprise p-type material and where regions 31 comprise n-type material diffused within one or both of the SLS structures.

Figure 4:
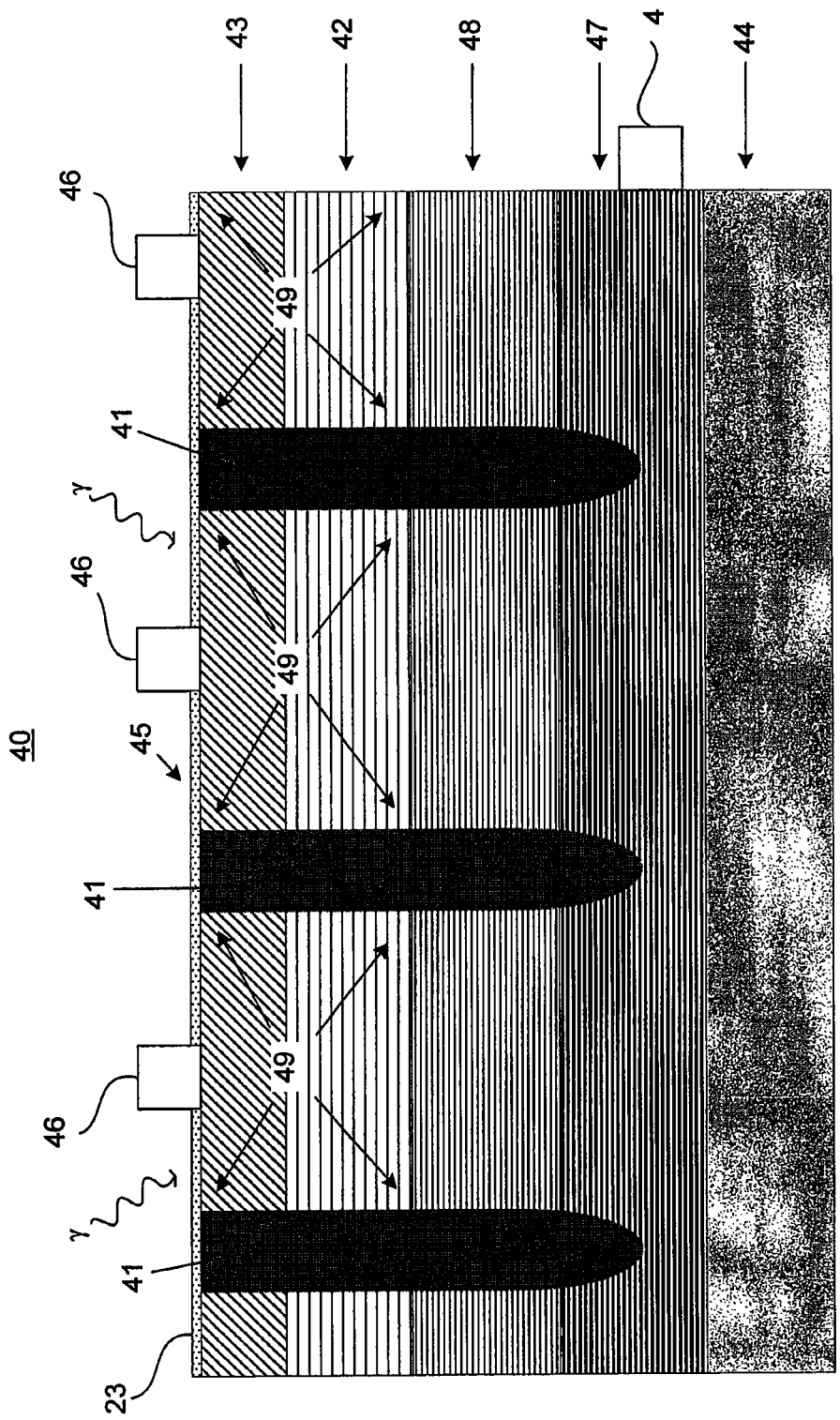
FIG. 4 is a cross sectional view of an n-on-p photodetector having p-type diffusion within n-type SLS structures according to another embodiment the invention.

FIG. 4 shows a cross sectional view of a portion of a photodetector 40 according to another embodiment of the invention. Photodetector 40 is an n-on-p detector having an array of photodiodes formed by isolating pixels of n-type material by surrounding the n-type material with p-type material using diffusion techniques similar to those employed in the embodiment of photodetector 30. In the context of this disclosure, the term pixel refers to an isolated volume of photosensitive material.

Photodetector 40 includes four layers of electrically conducting material deposited onto a planar substrate 44. These four layers may be SLS structures 42, 43, 47, and 48. Alternatively, structures 42 and 48 are SLS structures and structures 43 and 47 are wide band gap semiconductors. The bottom-most layer is layer 47. Layer 47 may be a lightly doped p-type SLS structure. Layer 47 may be provided to minimize unwanted charge generation and to facilitate electrical connection to adjacent layers. The second layer, layer 48, may be an SLS structure that is preferably formed from a photosensitive quantum confined detector material having the same carrier type (p-type) as layer 47. The third layer is layer 42, which may be a lightly doped SLS structure composed of a photosensitive quantum confined detector material. Layer 42, however, has a carrier type opposite that of layer 47. In this example, the opposite type is n-type. The fourth layer is layer 43, which forms the top surface of photodetector 40. Layer 43 may be another SLS structure, but may be formed from a material having a wider band gap than layer 42 and having the same carrier type (e.g. n-type) as layer 42. The bandgap of all the layers may be graded in manners known to those in the art to reduce the effects of interface recombination and to promote minority carrier collection.

The cross section shows a plurality of regions 41 extending into layers 42, 43, 47, and 48. In another embodiment (not shown), the regions 41 may penetrate to the second layer (layer 48) but may not penetrate to the first layer (layer 47). Regions 41 are p-type regions that diffuse into the SLS structures, for example, in an anisotropic manner. In one embodiment, the diffused p-type regions 41 may form a wide band-gap quaternary material. In another embodiment, p-type regions 41 may be formed from zinc or ions of zinc. In photodetector 40, however, the p-type regions 41 are not isolated from one another, that is, they may be interconnected as a grid or in some other configuration, for example, as a series of interconnected annular rings.

Figure 5:
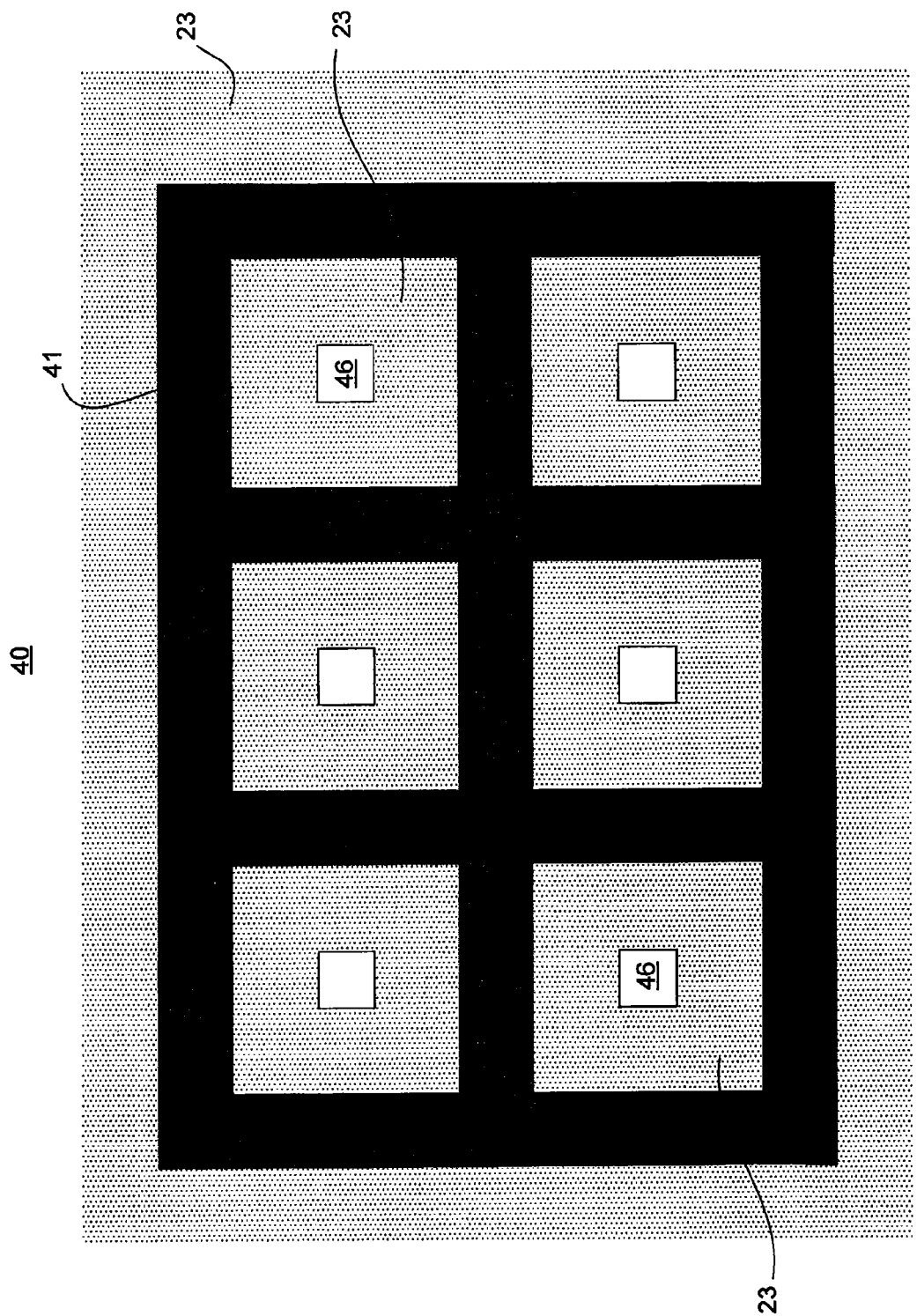
FIG. 5 is a top view of the photodetector array of FIG. 4.

With reference now to FIG. 5, a grid-like interconnection of p-type regions 41 can be seen from a top view looking downward at the top surface 45 of photodetector 40. As the grid of p-type regions 41 diffuses to second layer 48, which is itself a p-type material, a plurality of n-type pixels 49 become isolated within pockets of p-type material. Each pixel 49 of n-type material may substantially comprise a rectangular polyhedral volume formed from the topmost layer or layers of n-type SLS material. In this example, each pixel 49 is formed from n-type layers 42 and 43. The resulting photodiode structure provides a plurality of pixels 49 of electrically conducting material having a carrier type of a type opposite SLS structures 47 and 48. Each pixel 49 forms transversely oriented p-n junctions with the diffused regions 41 of p-type material, and forms horizontally oriented p-n junctions with SLS structure 48. Thus, each pixel 49 is isolated from all other pixels 49 within the SLS structures by material having an opposite carrier type.

Ohmic contacts 46 may be deposited on the top surface of each of the pixels 49 to provide a convenient connection point for coupling the photodiodes to external sensing circuitry. A voltage signal generated by collection of cavities at any particular pixel 49 may be sensed by the potential difference between an Ohmic contact 46 and a second contact 4 coupled to the first SLS structure 47 either directly or through the p-region 41 (as shown in FIG. 4).

Photodetector 40 functions according to the same principles as photodetector 30. Photons (γ) incident on the top surface of pixels 49 or through substrate 44 into pixels 49 and having sufficient energy will liberate carriers (electrons or holes). The photogenerated carriers will diffuse laterally within the pixels 49 to be collected by the diffused p-type regions 41, achieving better quantum efficiency than a vertical collection scheme within an SLS structure. The same advantages realized by photodetector 30 may be realized by photodetector 40, i.e. reduction in unwanted currents and elimination of sidewalls and passivation layers.

In another embodiment, a p-on-n photodetector may be configured as shown in FIGS. 4 and 5, where the SLS structures 42 and 43 comprise p-type material, where the SLS structures 47 and 48 comprise n-type material, and where the regions 41 comprise n-type material diffused within one or both of the p-type SLS structures 42 and 43. Alternatively, a n-on-p photodetector may be configured as shown in FIGS. 4 and 5, where the SLS structures 42 and 43 comprise n-type material, where the SLS structures 47 and 48 comprise p-type material, and where the regions 41 comprise p-type material diffused within one or both of the n-type SLS structures 42 and 43.

FIGS. 6 to 14 are illustrations that represent the salient steps in a process for fabricating a photodetector according to the invention. Such a photodetector may be fabricated as either p-on-n or n-on-p. The term "single carrier type" is used herein to designate a material whose conduction is dominated by either an n-type or a p-type carrier. In the context of any particular embodiment, when the single carrier type is a p-type carrier, then the opposite carrier type is n-type, and vice versa.

Figure 6:
FIG. 6 is a cross-sectional view of a substrate layer of an SLS photodetector having lateral collection architecture.

FIG. 6 illustrates an initial step for providing a substrate 50 for receiving depositions of one more photosensitive layers, such as SLS structures. Substrate 50, shown in magnified cross-section, may be any electrically conducting or semi-conducting material such as silicon-based substrate used in microfabrication and suitable for processes such as epitaxial crystal growth, doping, ion implantation, etching, deposition, or photolithographic patterning. By way of example and not by limitation, the thickness of substrate 50 may be on the order of a few tens of microns or a few hundred microns. For high quality device performance, however, the substrate growth surface should have few defects (such as dislocations) and should have a similar lattice constant to the average lattice constant of the layers to be grown on it. For the InAs—GaInSb SLS structures and its relatives (GaAlSb and quaternaries), GaSb is the preferred bulk substrate. Any compound substrate (e.g., GaSb grown on Si or GaAs) should have a growth surface comparably defect free and with comparable lattice constant to GaSb.

Figure 7:
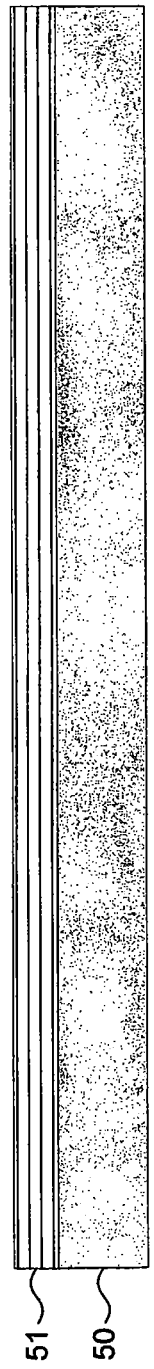
FIG. 7 is a cross-sectional view of a first conducting layer deposited on the substrate layer of the SLS photodetector of FIG. 6.

FIG. 7 illustrates the next step in the fabrication process. This cross-sectional view shows a first electrically conducting layer 51 deposited on substrate 50. Layer 51 is preferably an SLS structure having a single carrier type. The process used to deposit layer 51 may be any process known in the art for producing low defect epitaxial SLS layers, such as molecular beam epitaxy, atomic layer epitaxy, metal-organic vapor phase epitaxy or hot-wall epitaxy. By way of example and not by limitation, the thickness of layer 51 may be on the order of a few microns to a few tens of microns.

Figure 8:
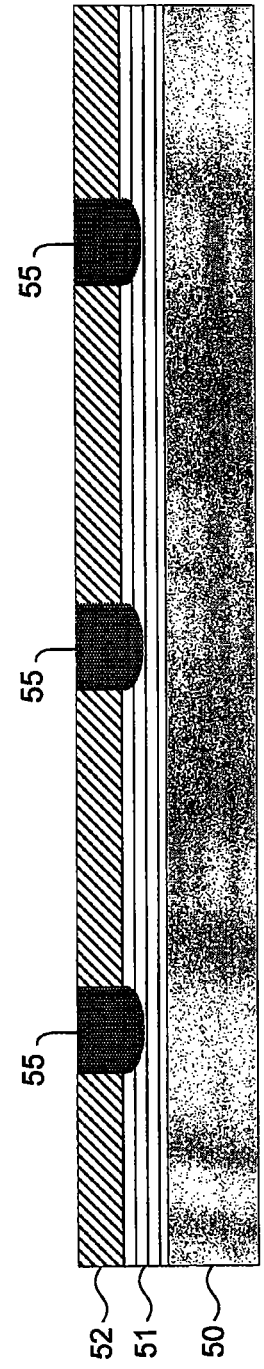
FIG. 8 is a cross-sectional view of a second conducting layer deposited on the first conducting layer of the SLS photodetector of FIG. 7.

FIG. 8 illustrates the next step in the fabrication process. This cross-sectional view shows a second electrically conducting layer 52 deposited onto the first layer 51. Layer 52 is preferably an SLS structure comprising a photosensitive quantum confined detector material that has the same carrier type as layer 51. The deposition process and thickness of layer 52 may be similar to those described for layer 51.

Figure 9:
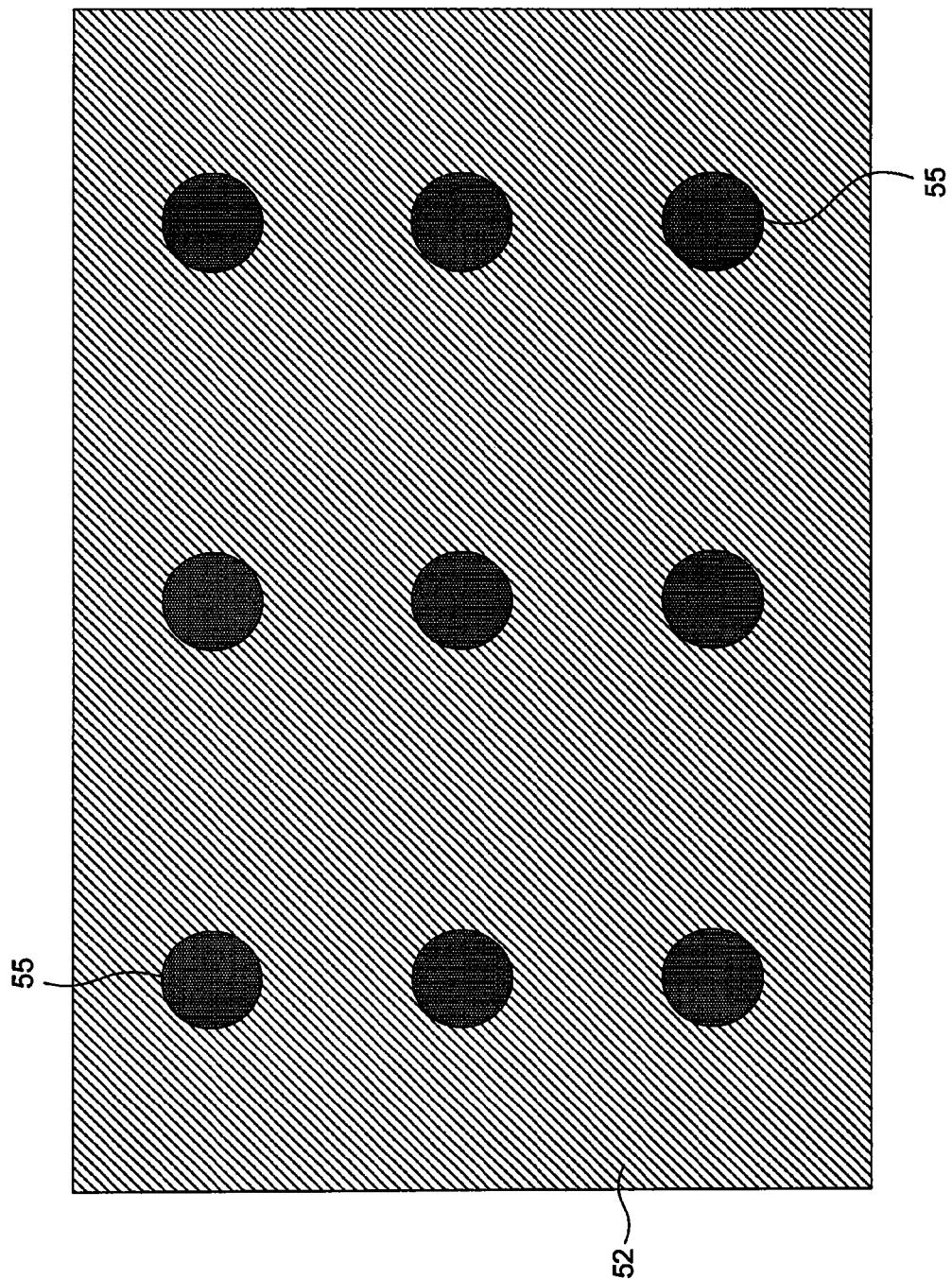
FIG. 9 is a top view of the SLS photodetector of FIG. 8 showing an array of unmasked regions of the top surface during fabrication.

FIG. 9 is a top view of the photodetector being fabricated. In the step depicted in this view, the second layer 52 is masked using a mask or masking material. The mask defines a masked region (or regions) 53 and an unmasked region (or regions) 54. In the embodiment shown, the mask defines a plurality of unmasked regions 54 that may be arranged in an array. The masking material may be a photoresist or other material known to resist etching. In another embodiment, the material may be a more durable mask such as silicon nitride. The unmasked regions 54 define the locations for introduction of a dopant into the SLS structure of layer 52. In other embodiments the dopant may also penetrate to layer 51. The mask may be selected according to the method used for introducing the dopant.

FIG. 10 illustrates the next step in the fabrication process. This view shows the unmasked regions 54 converted into diffusion doped regions 55. Diffusion doped regions 55 are regions where the laminar structure of sublayers within the SLS has been converted to an opposite conductivity type from layers 51 and 52. Desirably for some applications, the diffusion process may disorder the SLS creating a wide-band gap doped region with lower dark currents. For example, in a p-on-n embodiment, a dopant having good diffusivity such as zinc may be introduced at the unmasked regions to promote diffusion therethrough, for example, by a vapor deposition technique and proper temperature controls. In another embodiment, the dopant may be introduced by bombarding the unmasked regions with high-energy ions. Dopants other than zinc, whether p-type or n-type dopants, may be used for converting an unmasked region of opposite carrier type. Preferably, these dopants include ions of any of the Group II elements (such as beryllium) or Group VI elements (such as tellurium).

The dopant and conversion method should be selected so that the dopant converts the carrier type of the superlattice within the doped region into an opposite carrier type. This doping process may also desirably disorder the superlattice to create a semiconductor comprising a homogeneous multinary (e.g., a ternary, quaternary, quintnary, sestinary, etc.) (or higher component number depending on what is present in the SLS) material, such as indium-gallium-arsenide-antimonide (e.g., InGaAsSb in proportion to In, Ga, As and Sb in the superlattice from which the homogonized region was made) or indium-aluminum-gallium-arsenide-antimonide (e.g., InAlGaAsSb in proportion to In, Al, Ga, As, and Sb in the superlattice from which the homogonized region was made), which provides a wider band gap than the surrounding superlattice. A representative depth of the doped regions 55 are depicted in the cross-sectional view of FIG. 11, which is taken along section A-A in FIG. 10. The doped regions 55 may extend only partially into the second layer 52. Or, as shown in the figure, they may extend through the second layer 52 and at least partially into the first layer 51.

Figure 12:
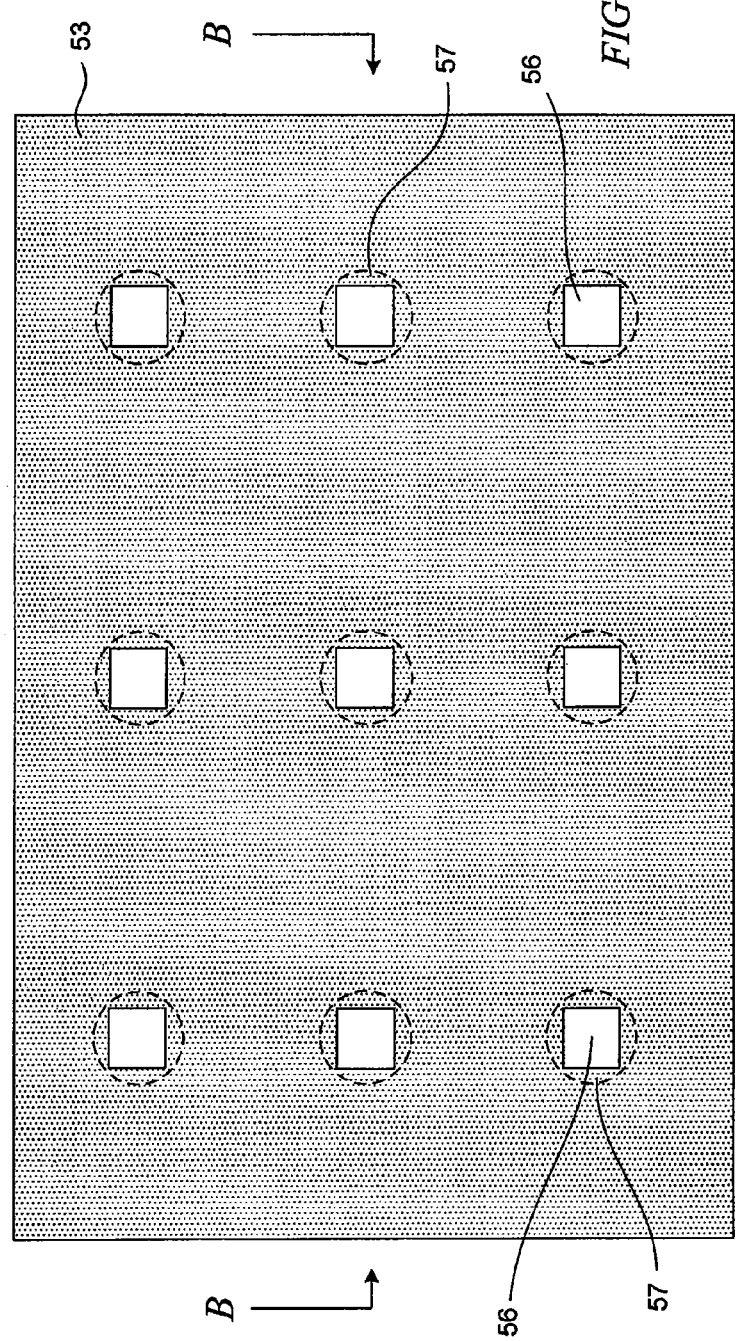
FIG. 12 is a top view of the SLS photodetector of FIG. 10 showing unmasked regions on the top surface for locating Ohmic contacts during fabrication.
Figure 13:
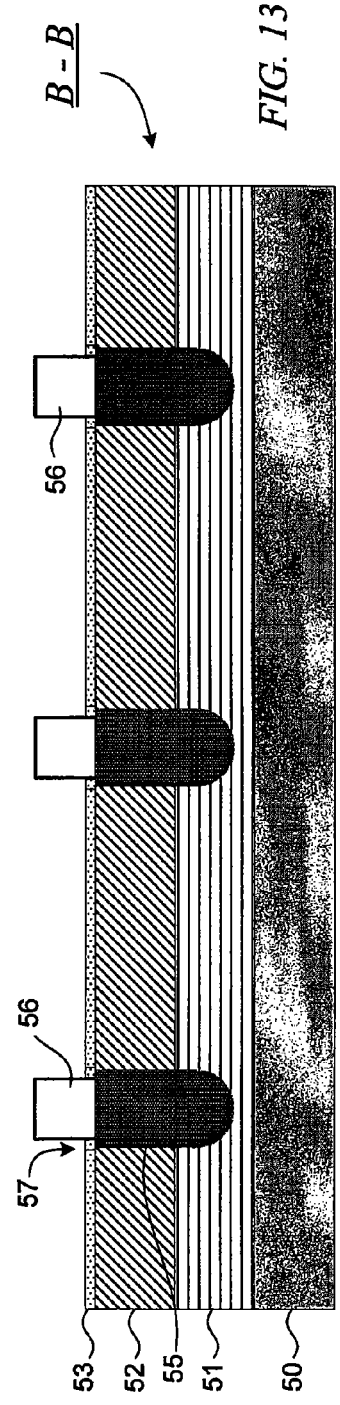
FIG. 13 is a cross-sectional view of the SLS photodetector of FIG. 12 taken along section B-B.

FIG. 12 shows another top view of the photodetector under fabrication to illustrate the next process step. In this step, the doped regions 55 are partially masked at the top surface of the photodetector at areas 57. This masking step defines locations for deposition of Ohmic contacts 56 at the top of each of the doped regions. The masking type and technique may be similar to that used to achieve masked region 53. The next step of depositing the Ohmic contacts 56 is depicted in FIG. 13, which shows a cross-sectional view of the photodetector of FIG. 12 taken along section B-B. The deposition may be effected by evaporating or sputtering or other suitable microfabrication method.

Figure 14:
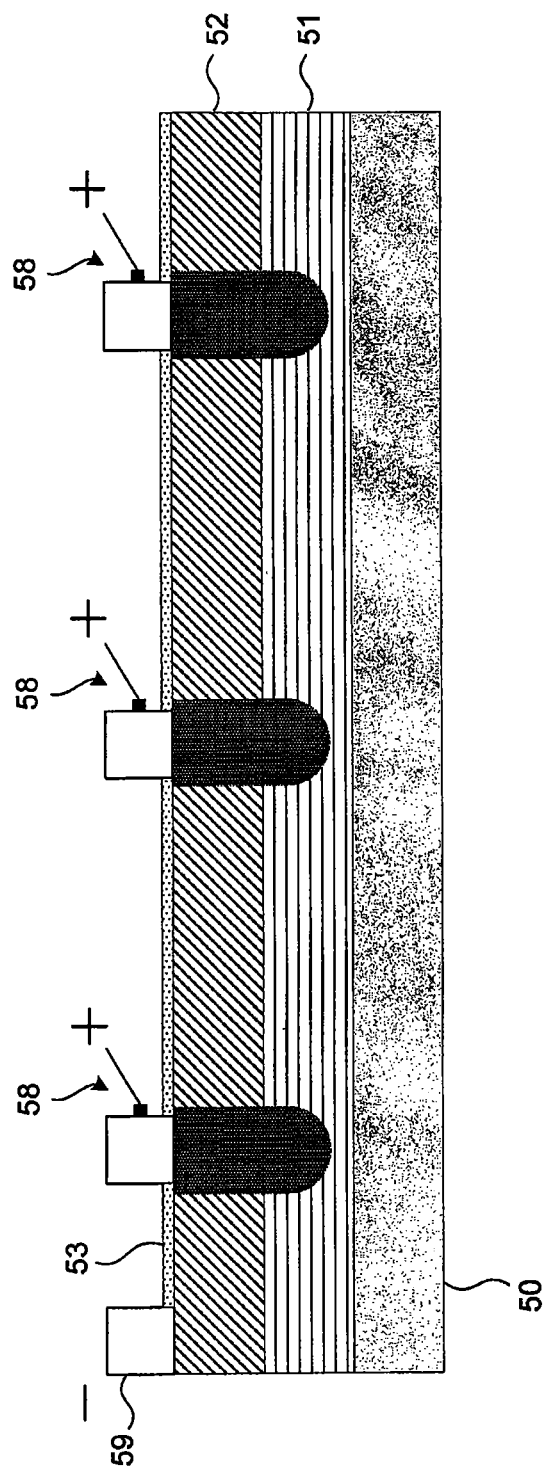
FIG. 14 is a schematic view of the SLS photodetector of FIG. 12 illustrating terminal points for electrically coupling the detector to external circuitry.

The final salient step in the fabrication method is illustrated in FIG. 14. This is another cross-sectional conceptual view of the photodetector of FIG. 12. In the final step, electrical connections 58 having a first polarity (positive) are coupled to the Ohmic contacts 56, and a common electrical connection 59 having a second polarity opposite that of the first polarity (negative) is coupled to layers 51 and 52. Connection 59 may be made through substrate 50 by connecting 59 to a convenient location on the substrate, provided that the substrate 50 has the same polarity as layers 51 and 52. The connections 58 and 59 facilitate electrical communications to external sensing circuits. For purposes of illustration only, the connections are shown for a p-on-n embodiment, with the positive terminals at Ohmic contacts 56, and the common contact at the substrate. For n-on-p, the polarities are reversed. If desired, the top and/or bottom layers of the photodetector may be coated with an environmental encapsulant (not shown).

FIGS. 15 to 26 are illustrations that represent the salient steps in another process according to the invention for fabricating a photodetector. These steps produce the four-layer detector with regions of dopant diffused to a depth of the second layer to isolate pixels of a single carrier type, as in photodetector 40. Such a photodetector may be fabricated as either p-on-n or n-on-p. Generally, a deep diffused diode has fewer layers than a grid isolation diode. Also, fewer or greater layers may be used depending on whether the substrate or other layers have appropriate properties to fulfill the same or similar function as one or more of them.

Figure 15:
FIG. 15 is a cross-sectional view of a substrate layer of an embodiment of an SLS photodetector having lateral collection architecture.
Figure 16:
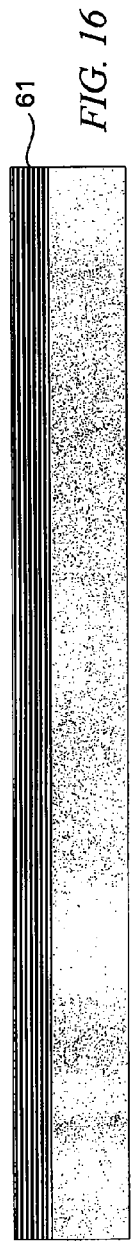
FIG. 16 is a cross-sectional view of a first conducting layer deposited on the substrate layer of the SLS photodetector of FIG. 15.
Figure 17:
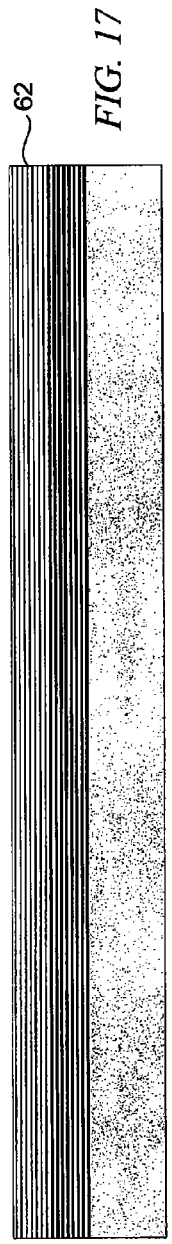
FIG. 17 is a cross-sectional view of a second conducting layer deposited on the first conducting layer of the n-on-p SLS photodetector of FIG. 16.

FIGS. 15 to 17 illustrate the first three steps in the fabrication process for providing a substrate 60, a first layer 61, and a second layer 62. These initial steps may be similar or identical to the steps shown in FIGS. 6-8, except that the carrier type of layers 61 and 62 is chosen to be of the same carrier type as the dopant that is later selected to create doped regions. Accordingly, substrate 60 is suitable for receiving depositions of one more photosensitive layers, and layers 61 and 62 are electrically conducting layers, preferably SLS structures of a common carrier type. Layer 61 may be selected from a material that facilitates electrical connection to adjacent layers and minimizes unwanted charge generations. Layer 62 may comprise a quantum confined detector material. Layers 61 and 62 may be produced using known deposition methods such as molecular beam epitaxy or sputtering. As an example, the thicknesses of substrate 60 are on the order of tens or hundreds of microns, and the thicknesses of layers 61 and 62 may be on the order of a few microns to a few tens of microns. Layer 62 may have a narrower bandgap than layer 61, to become the primary "active" or absorbing layer for the light of interest. In general, the light absorbing "active" layer in all these structures is a quantum confined layer with a band gap narrower than or equal to that of any other layers in the structure.

Figure 18:
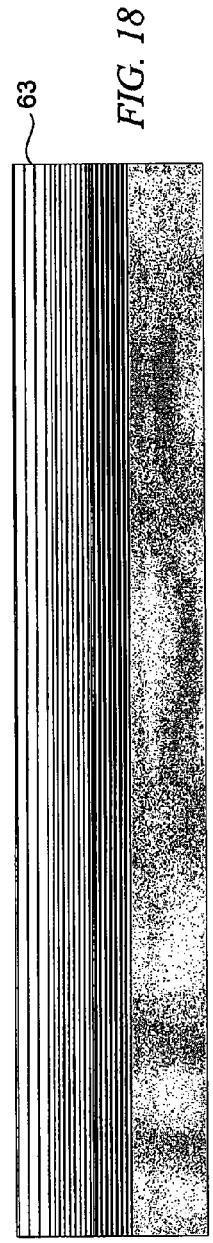
FIG. 18 is a cross-sectional view of a first conducting layer deposited on the second conducting layer of the SLS photodetector of FIG. 17.

FIG. 18 illustrates the next step in the fabrication process in cross-sectional view. In this step, a third electrically conducting layer 63 is deposited onto the second layer 62. Layer 63 is preferably an SLS structure comprising a photosensitive quantum confined detector material that has a carrier type of a type opposite that of layers 61 and 62 and has a band-gap wider than or equal to that of the narrowest band gap layer in the structure. The active layer band-gap may be graded and doped to enhance charge collection by the correct pixel and to reduce cross-talk. The deposition process and thickness of layer 63 may be similar to those previously described.

Figure 19:
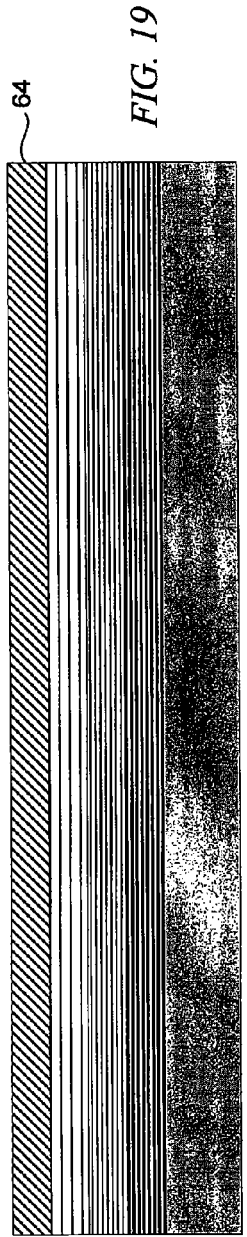
FIG. 19 is a cross-sectional view of a second conducting layer deposited on the first conducting layer of the SLS photodetector of FIG. 18.

FIG. 19 illustrates the next step in the fabrication process. In this step, a fourth electrically conducting layer 64 is deposited onto the third layer 63. Layer 64 may be another SLS structure. Layer 64 may be selected from a material that has the same carrier type and a wider band gap than layer 63. The deposition process and thickness of layer 64 may be similar to those previously described.

Figure 20:
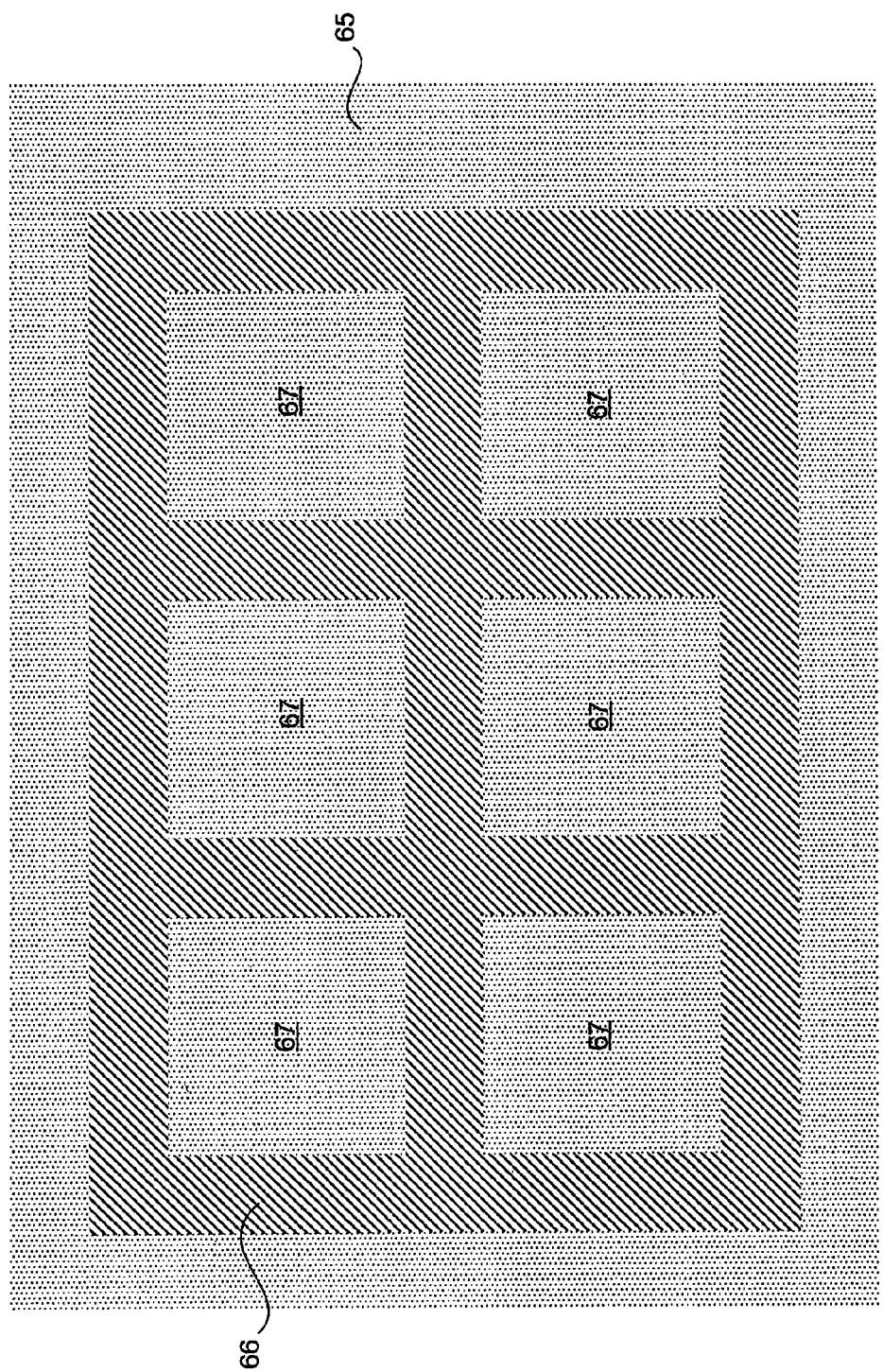
FIG. 20 is a top view of the SLS photodetector of FIG. 19 showing a grid pattern of unmasked regions of the top surface during fabrication.

FIG. 20 is a top view of the photodetector being fabricated. In the step depicted in this view, the fourth layer 64 is masked, using a masking material similar to material previously described. The mask defines masked regions 65 and 67 and an unmasked region 66. In particular, the mask defines a plurality of unmasked regions 67 that may be arranged in an array. The unmasked region 66 defines the locations where a dopant will be introduced on the surface of layer 64, and penetrate downward into the SLS structures of layers 64, 63, and 62. In some embodiments, the dopant may also penetrate into layer 61.

Figure 21:
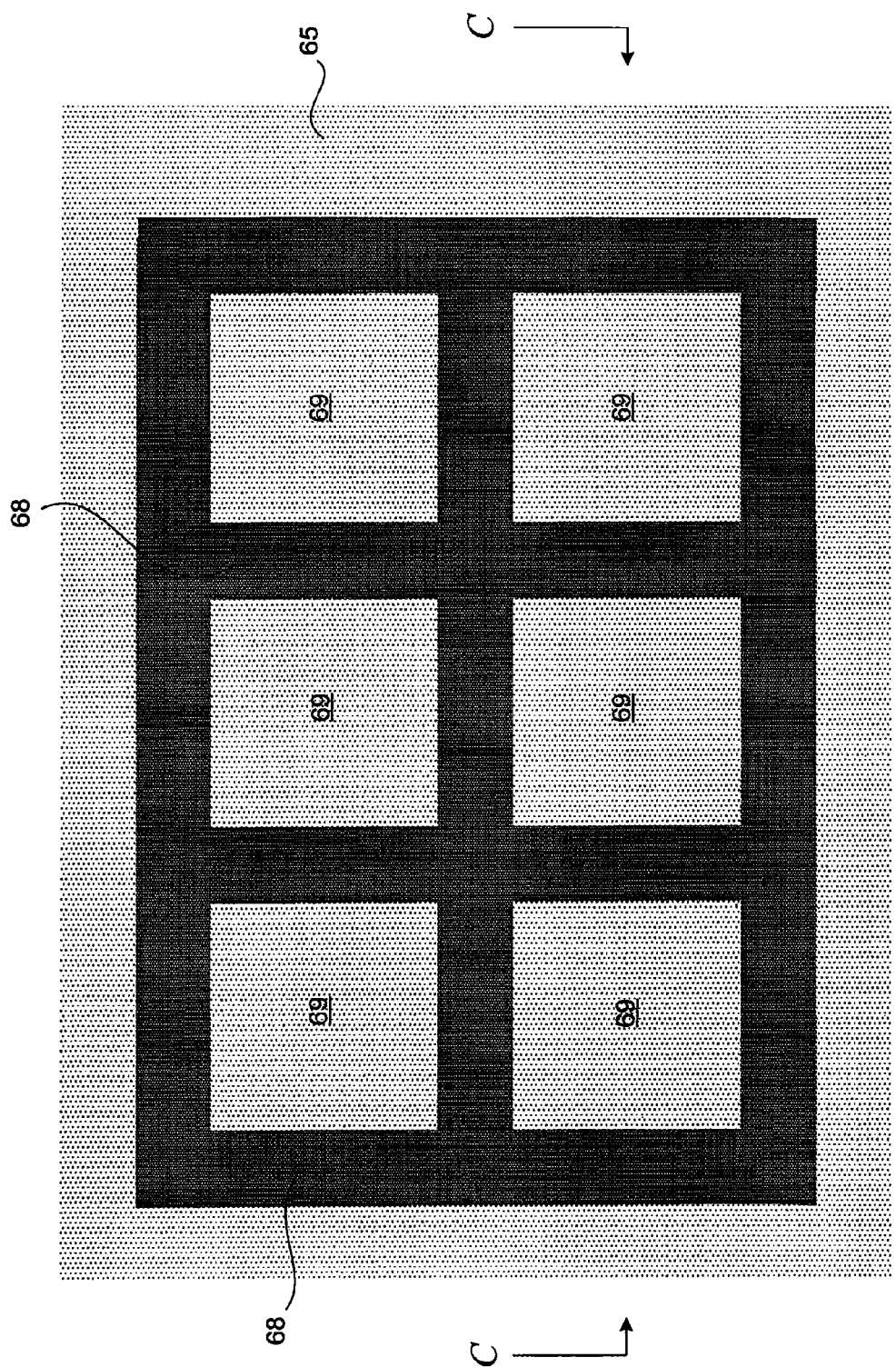
FIG. 21 is a top view of the SLS photodetector of FIG. 20 illustrating diffusion of a single carrier type material into the unmasked grid-like region.

FIG. 21 is a top view of the photodetector illustrating the next step in the fabrication process. This view shows the formerly unmasked regions 67 converted into doped regions 68. Doped regions 68 have been converted by introducing the dopant into the SLS structures in similar fashion as described with regard to FIG. 10, i.e. by a vapor deposition, diffusion, or ion implantation technique. As mentioned there, the doping process may desirably convert the SLS regions into an alloy of the SLS components, thus raising the band gap and further lowering dark currents from this region. The dopant and conversion method should be selected so that the dopant converts the carrier type of the superlattice structures of layers 64 and 63 into an opposite carrier type, but only within the regions 68.

As shown in FIG. 22, which is taken along section C-C of FIG. 21, the grid-like geometry of the doped regions 68 penetrates at least partially into layer 61. In another embodiment (not shown) the doped regions 68 penetrate into layer 62 but not into layer 61. Because doped regions 68 have a carrier type similar to layer 62 but opposite those of layers 63 and 64, the portions of layers 63 and 64 that lie beneath masked regions 67 are converted to a plurality of isolated pixels 69. That is, each pixel 69 may comprise a rectangular polyhedral region formed from layers 63 and 64. Each of these pixels is isolated from all other pixels by carrier material of a type opposite the carrier type of the pixel. Each pixel 69 forms transversely oriented p-n junctions with the doped regions 68, and forms horizontally oriented p-n junctions with SLS structure 62. The transversely oriented p-n junctions improve quantum efficiency by optimizing collection of laterally mobilized photogenerated charge carriers.

Figure 23:
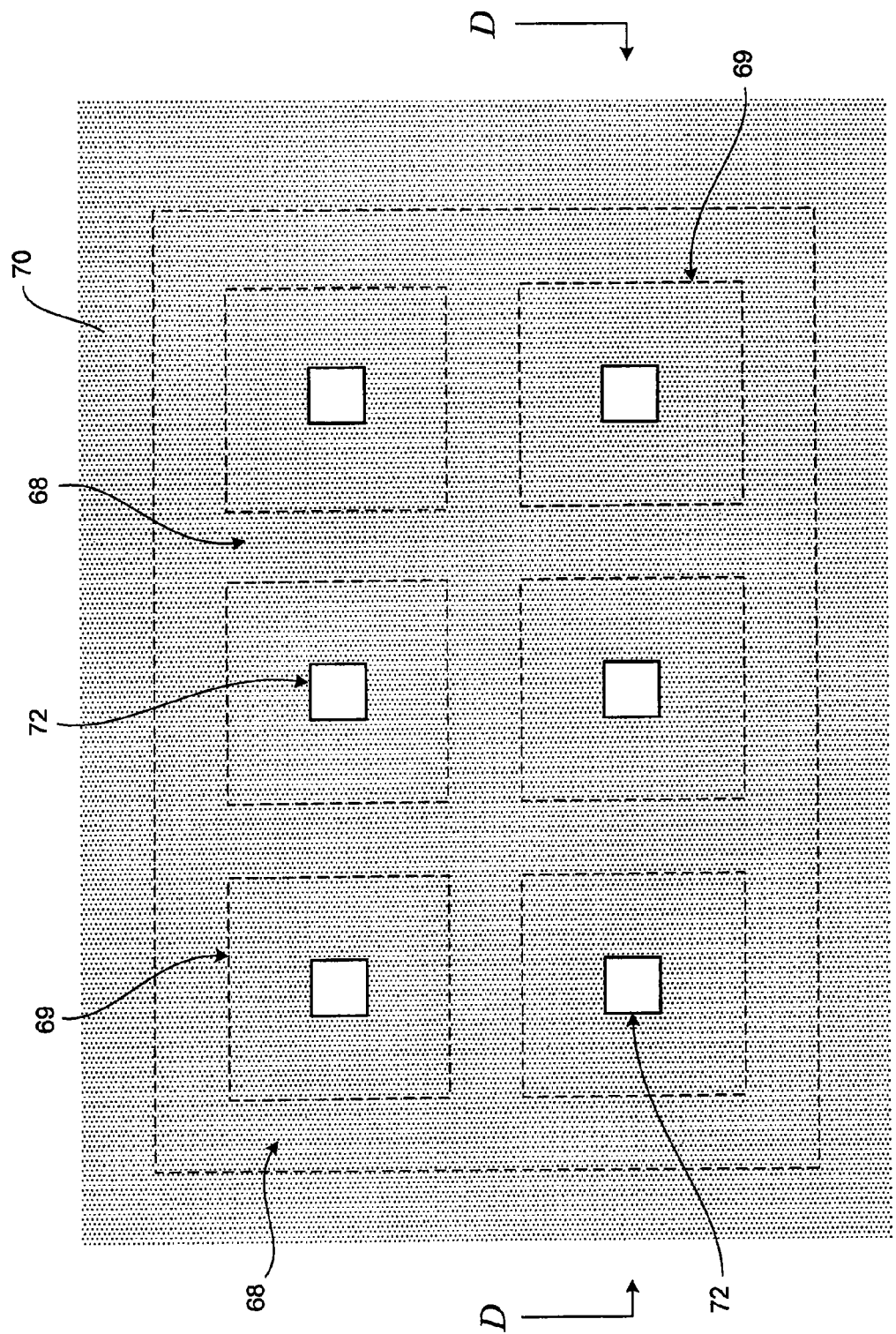
FIG. 23 is a top view of the SLS photodetector of FIG. 22 showing unmasked regions on the top surface for locating Ohmic contacts during fabrication.

FIG. 23 shows another top view of the photodetector under fabrication to illustrate the next process step. At this stage, a mask 70 is installed on the fourth or top layer of the photodetector using known masking techniques to define locations for deposition of Ohmic contacts. The doped regions 68 may be completely masked in this step, and one or more unmasked regions 71 may be located about the top surface of the photodetector at each pixel 69. The next step of depositing the Ohmic contacts 72 is depicted in FIG. 24, which shows a cross-sectional view of the photodetector of FIG. 23 taken along section D-D. The deposition may be effected by etching or sputtering or other suitable microfabrication method.

Figure 25:
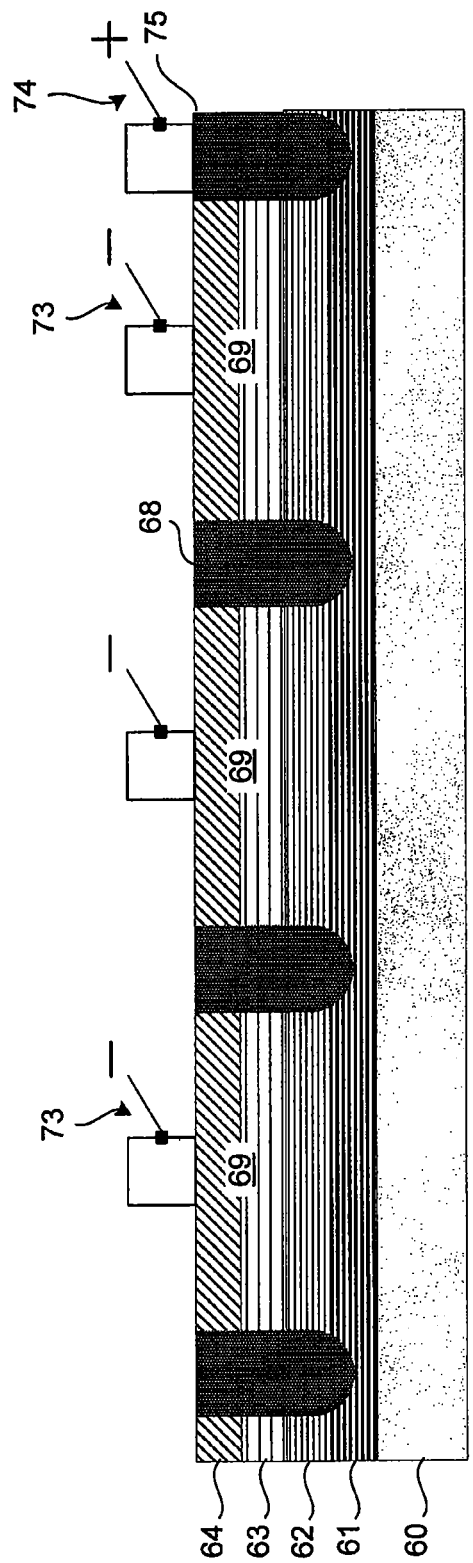
FIG. 25 is a cross-sectional view of another embodiment of the SLS photodetector of FIG. 24 illustrating terminal points for electrically coupling the photodetector to external circuitry.

In FIG. 25, the opposite polarity connection 74 is made at the top of the photodetector to a specialized doped region 75. The + and − signs, respectively, indicate the sign of the photocurrent emitted from these contacts when the detectors are illuminated and the circuit collecting the current has low impedance and does not apply a bias to the structure. Doped region 75 may be diffused or implanted in a manner similar to, and possess similar material as doped regions 68. The purpose of region 75 is to provide a convenient termination point on the top surface of the photodetector for making a common electrical connection to all of the interconnected doped regions 68. In FIG. 25, the connections 73 and 74 facilitate electrical communications to external sensing circuits. The connections are shown for an n-on-p embodiment, with negative terminals corresponding to negative detector Ohmic contacts 72 and a positive Ohmic contact at the substrate. For p-on-n, the polarities are reversed. If desired, the top and/or bottom layers of the photodetector may be coated with an environmental encapsulant (not shown).

In all of the foregoing photodetector embodiments, the quantum efficiency obtainable using a lateral collection architecture will depend to a certain degree on the effectiveness of the diffusant that is used to dope the superlattice during the conversion step. While zinc is known to possess good diffusion characteristics, other elements such as beryllium will not diffuse so easily, but due to their small atomic size are better suited for ion implantation. To enhance the effectiveness of a diffusion or implantation, and to promote formation of the doped regions, any of the foregoing fabrication processes may include a step according to the invention for forming cavities in the SLS structure. The cavities may be formed to direct the dopant more deeply into the SLS structures in a direction transverse to the layers, for example, by using a dry etch, a wet chemical etch, or a combination of the two types of etch at each of the unmasked regions prior to introducing the dopant into the cavities. The etch may be followed by anneals in appropriate ambient environments to restore stoichiometry and/or reduce damage induced by etching and/or to widen the band-gap of the surface region, all of which can help reduce dark currents.

Figure 26:
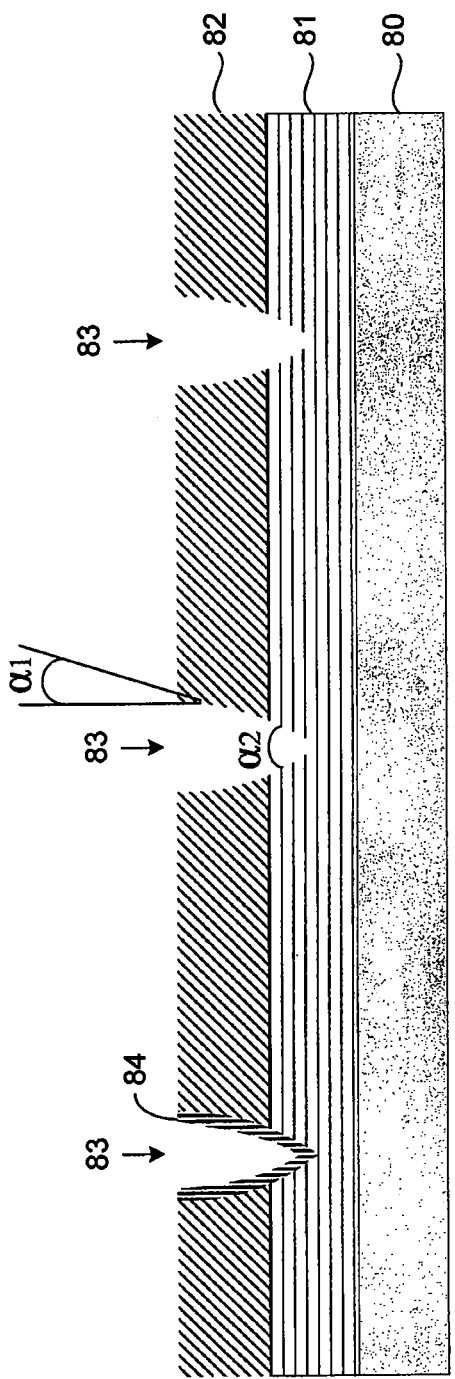
FIG. 26 is a cross-sectional view of a photodiode structure being fabricated for lateral collection by forming cavities in the top SLS structures to promote anisotropic diffusion of p-type or n-type material.

FIG. 26 illustrates this step. FIG. 26 shows a lateral collection photodetector under fabrication. The photodetector has two SLS structures 81 and 82 of the same carrier type deposited on a substrate 80. A plurality of cavities 83 are formed at the top surface of the photodetector. Each cavity 83 penetrates one or both of the SLS structures 81 and 82 to a desired depth. The diameter and depth of each cavity may optionally be somewhat less than the desired dimensions of the doped regions to be achieved after optionally diffusing a dopant 84 into the cavity 83. The dopant 84 is diffused or implanted into the SLS structures 81 and 82 through the cavity walls. Ideally, the cavities 83 may be cylindrical and anisotropic; however, formation by wet and some dry etching techniques may result in isotropic cavities with a rounded shape. Anisotropic cavities 83 (as shown) may be formed more successfully using an ion bombardment technique or plasma etch.

After etching or otherwise forming the cavities 83 in one or more SLS structures 81 and/or 82, the fabrication process may include a step for covering the interior surface of each cavity 83 with a material 84 that can widen the bandgap of the region surrounding the cavity 83. In one embodiment, a polycrystalline material 84 may be diffused into the walls of cavity 83. In another embodiment, the diffusion of the polycrystalline material 84 may be followed by an ion bombardment of another material such as beryllium to further enhance the interdiffusion of materials that doped the superlattice of the SLS structure surrounding the cavity 83. Other sequential combinations of etching, diffusion, and ion implantation of dopants are possible within the scope of the invention to dope the superlattice and form transversely oriented single carrier-type regions to enable lateral collection of photogenerated charge carriers.

Another characteristic of the cavities 83 formed through an SLS structure is the angle $\alpha 1$ between a vertical axis and the approximate slope of the cavity wall, as shown. For a conically or rounded shaped cavity, the angle $\alpha 1$ is approximately half of the vertex angle $\alpha 2$ of the cone. The angle $\alpha 1$ should be kept between about 15 and about 30 degrees, or equivalently, the vertex angle $\alpha 2$ should be kept to between about 30 and about 60 degrees. The reason for these ranges is that photons incident on the sloped wall should be directed downward into the SLS structures to increase the probability of liberating a charge carrier, and thereby maximize quantum efficiency. If, for example, the angle $\alpha 1$ is 45 degrees or greater, photons incident on one cavity wall may be reflected to the opposite wall and then upward out of the cavity, without being absorbed to generate a photosignal. A 30 degree angle or less than 30 degree angle ensures that for most applications even the most off-normal light rays will be reflected into the absorbing medium.

Figure 27:
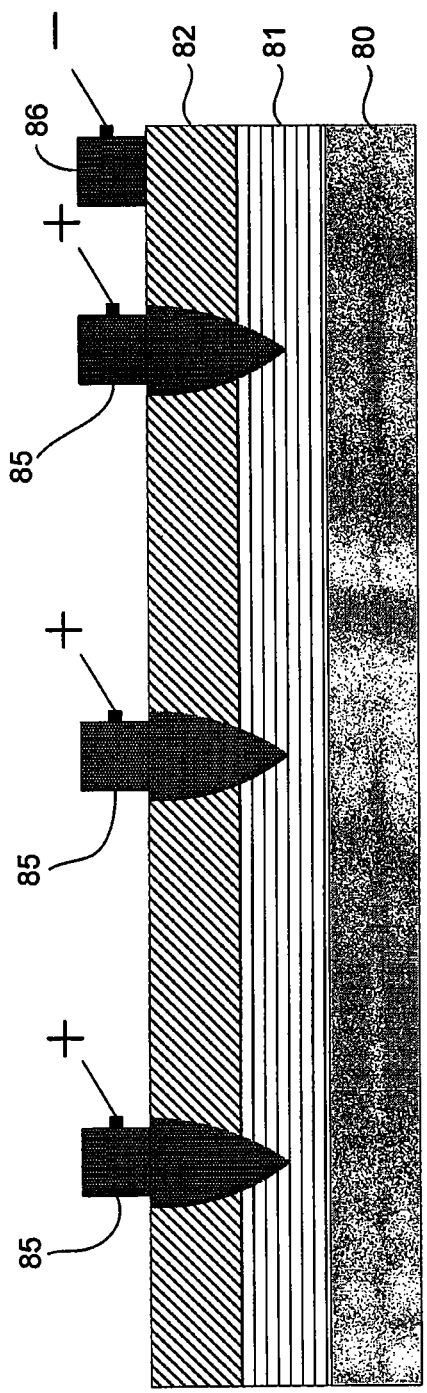
FIG. 27 is a cross-sectional view of a photodetector where each cavity is filled with a conducting contact material and also extends beyond the cavity to form a contact above the top surface of the SLS structure.

FIG. 27 shows the photodetector where each cavity 83 is filled with an Indium material 85 and also extends beyond the cavity 83 to form a contact above the top surface of the SLS structure 82. Other metals may be used other than Indium (e.g., Au, MoN, Al, Ti, or others or multilayers of these materials) may be used to suit the purposes of contacting the material as will be familiar to those of skill in the art of making metal contacts to semiconductor devices. A n-on-p photodetector may be configured as shown in FIGS. 26 and 27, where the SLS structure 82 comprises n-type material, where the SLS structure 81 comprises p-type material, and where the regions 85 comprise p-type material diffused within both the SLS structures 81 and 82. Alternatively, a p-on-n photodetector may be configured as shown in FIGS. 26 and 27, where the SLS structure 82 comprises p-type material, where the SLS structure 81 comprises n-type material, and where the regions 85 comprise n-type material diffused within both the SLS structures 81 and 82. The regions 85 may also extend into the substrate 80. If region 85 is p-type material, then the substrate 80 is p-type material. Similarly, if region 85 is n-type material, then the substrate 80 is n-type material.

Figure 28:
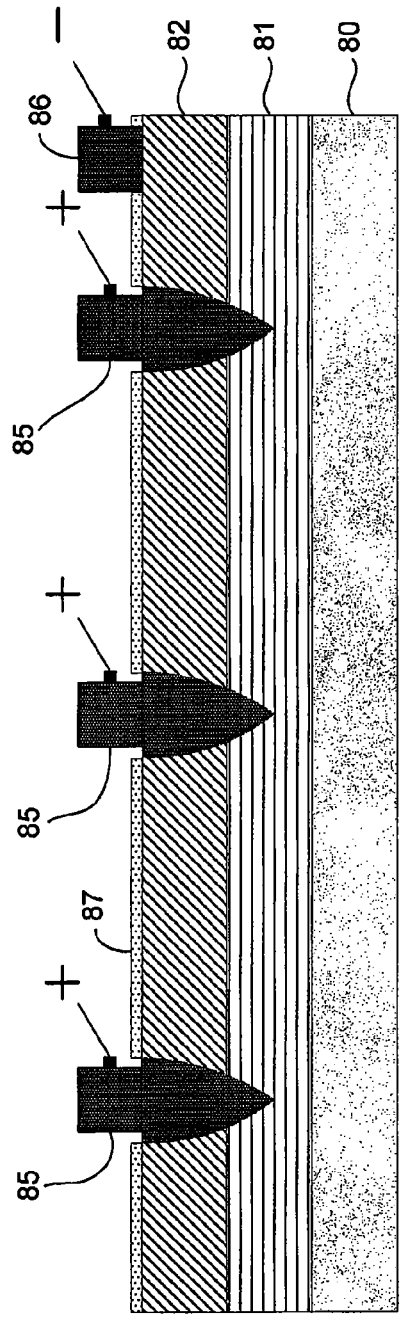
FIG. 28 shows an environmental encapsulant deposited over the photodetector of FIG. 27.

FIG. 28 shows an environmental encapsulant 87 deposited over the photodetector of FIG. 27. The environmental encapsulant 87 is typically an insulator with adequate mechanical strength to protect the photodetector from electrically and/or chemically active contamination. Examples of the environmental encapsulant 87 include polyimide, $SiO_2$, $Si_3N_4$, and comparable semiconductor materials. The metal contact need not fill the cavity but may simply extend into the cavity to make contact with the doped diffused region and extend onto the top of the passivating layer (not shown) deposited on the surface of layer 82.

Figure 29:
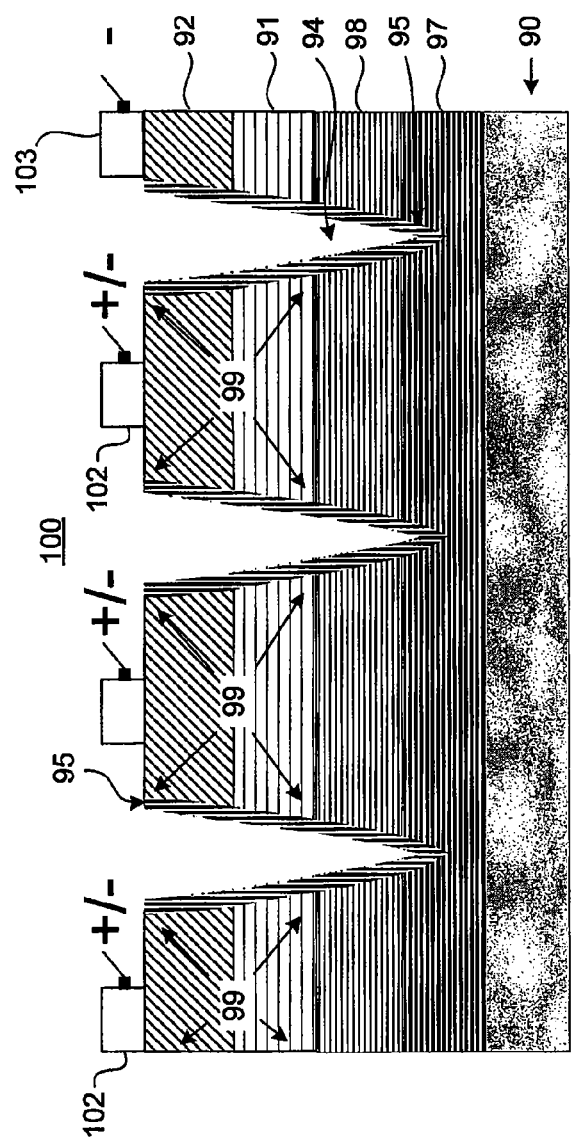
FIG. 29 is a magnified cross-sectional view of another embodiment of an SLS photodetector fabricated for lateral collection by forming cavities in the top SLS structures to promote anisotropic diffusion of a single carrier type material in a grid pattern to form diodes by isolation in a manner analogous to that done by diffusion alone in the structure of FIG. 24.

FIG. 29 is a cross sectional view of a segment of a photodetector structure 100 that is fabricated for lateral collection according to the methods described herein. Photodetector 100 comprises an embodiment having four SLS structures, wherein layers 91 and 92 have the same carrier type, and wherein layers 97 and 98 both have a carrier type that is opposite that of layers 91 and 92. A dopant is implanted and/or diffused in a grid-like pattern through the top surface to form doped regions 94 that disorder the superlattice to convert its carrier type to an opposite carrier type and thereby form p-n junctions for lateral collection of photogenerated carriers. The depth of the grid of doped regions 94 extends at least as far as the nearest SLS structure that has the same carrier type as the doped region, e.g. layer 98. The grid, by diffusing to layer 98, isolates a plurality of pixels 99 that are each formed from rectangular polyhedral regions of layers 91 and 92. Layer 92 may be a quantum confined detector material, and doped region 94 may be bordered by a layer of wide bandgap material 95. Ohmic contacts 102 are deposited on the surface of each pixel 99 to facilitate coupling the pixels to external connections of a first electrical polarity. An Ohmic contact (not shown) for coupling external common connections of an opposite electrical polarity may be coupled remotely to layers 97 and/or 98 or through a substrate 90. This common contact may be made through a contact to the grid itself (also not shown).

Figure 30:
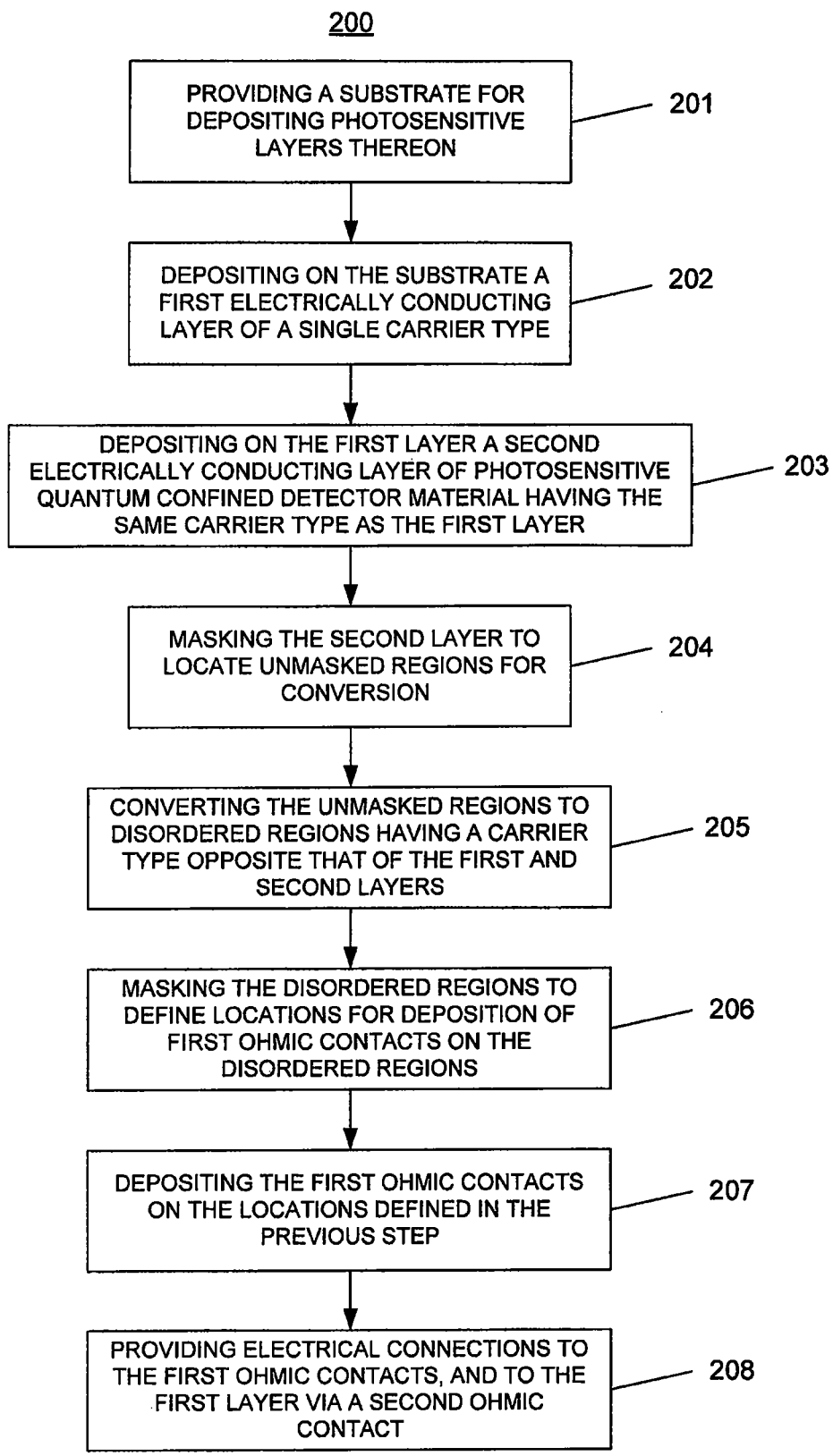
FIG. 30 is a process flow chart illustrating steps in a method according to the invention for fabricating a lateral collection SLS photodetector having isolated doped regions arranged in an array.

FIG. 30 shows a flow chart illustrating the salient steps in a process 200 for fabricating a lateral collection SLS photodetector having isolated doped regions arranged in an array. These steps may produce SLS photodetectors of the type depicted in FIGS. 2, 14, and 28. The process begins at step 201, in which a substrate is provided for the deposition thereon of photosensitive layers, such as the various SLS structures discussed herein, i.e. structures that allow greater lateral mobility of charge carriers than vertical mobility. Next, in step 202, a first electrically conducting layer having a single carrier type is deposited on the substrate. Next, in step 203, a second electrically conducting layer is deposited on the first layer. The second layer may be a layer of photosensitive quantum confined detector material having the same carrier type as the first layer. In the next step 204, the surface of the second layer is masked to locate unmasked regions for conversion of carrier type. Next, step 205 involves converting the unmasked regions to doped regions. The doped regions are made to have a carrier type opposite that of the first and second layers, and may penetrate only to the second layer, or through the second layer and into the first layer or through the second and first layers and into the substrate. In the next step 206, the doped regions are masked to define locations for deposition of first Ohmic contacts on the surface of the doped regions. Then in step 207, the first Ohmic contacts are deposited on the locations defined in step 206. In the final step 208, electrical connections are provided to (i) the first Ohmic contacts, and (ii) the first layer by means of a second Ohmic contact that is electrically isolated from the first Ohmic contacts.

Figure 31:
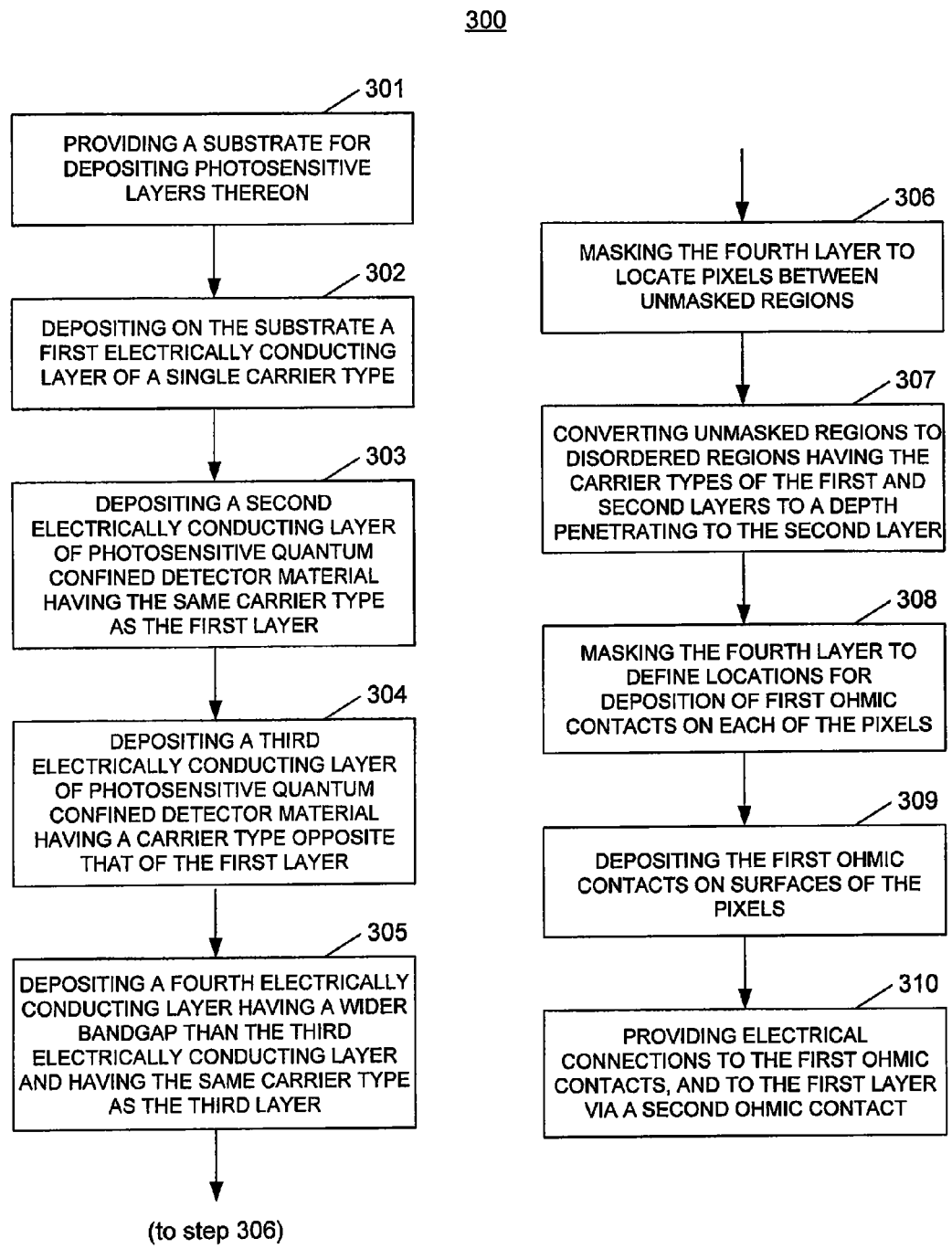
FIG. 31 is a process flow chart illustrating steps in a method according to the invention for fabricating a lateral collection SLS photodetector having an array of pixels isolated by a doped grid-like region.

FIG. 31 shows a process flow chart illustrating the salient steps in a process according to the invention for fabricating a lateral collection SLS photodetector having an array of pixels isolated by a doped grid-like region. These steps may produce SLS photodetectors of the type depicted in FIGS. 4, 25, 28 and 29. The process begins at step 301, in which a substrate is provided for the deposition of photosensitive layers of material thereon. Next, in step 302, a first electrically conducting layer having a single carrier type is deposited on the substrate. Next, in step 303, a second electrically conducting layer of photosensitive quantum confined detector material having the same carrier type as the first layer is deposited on the first layer. In the next step 304, a third electrically conducting layer is deposited on the structure. The third layer may comprise a photosensitive quantum confined detector material that has a carrier type opposite that of the first and second layers. Next, in step 305, a fourth layer of material is deposited. The fourth layer may be another electrically conducting material, and may have a wider bandgap than the third layer. The first, second, third, and fourth layers may be SLS structures that allows greater lateral mobility of charge carriers than vertical mobility. In the next step 306, the surface of the fourth layer is masked to locate pixels between unmasked regions. Next, step 307 involves converting the unmasked regions to doped regions. The doped regions are made to have a carrier type opposite that of the third and fourth layers, and may penetrate at least to the depth of the second layer. Converting the unmasked regions in this manner means modifying chemical and physical properties of the unmasked regions to create the pixels, such that each pixel is formed from the third and fourth electrically conducting layers, has a single carrier type, and is isolated from all other pixels by the doped regions and by the second electrically conducting layer. In the next step 308, the fourth layer is masked to define locations for deposition of first Ohmic contacts on the surface of each of the pixels. Then in step 309, the first Ohmic contacts are deposited on the pixels. Finally, in step 310, electrical connections are provided to (i) the first Ohmic contacts, and (ii) the first layer by means of a second Ohmic contact that is electrically isolated from the first Ohmic contacts.

Returning now to the concept of a mesa structure, the final two figures illustrate how a method according to the invention may be used to improve passivation of mesa sidewalls. This variation of the invention uses the foregoing diffusion and implantation techniques to create a doped region on the top and sidewalls of the mesa diode, but separated from the doped region on adjacent mesas by an n-type region.

Figure 32:
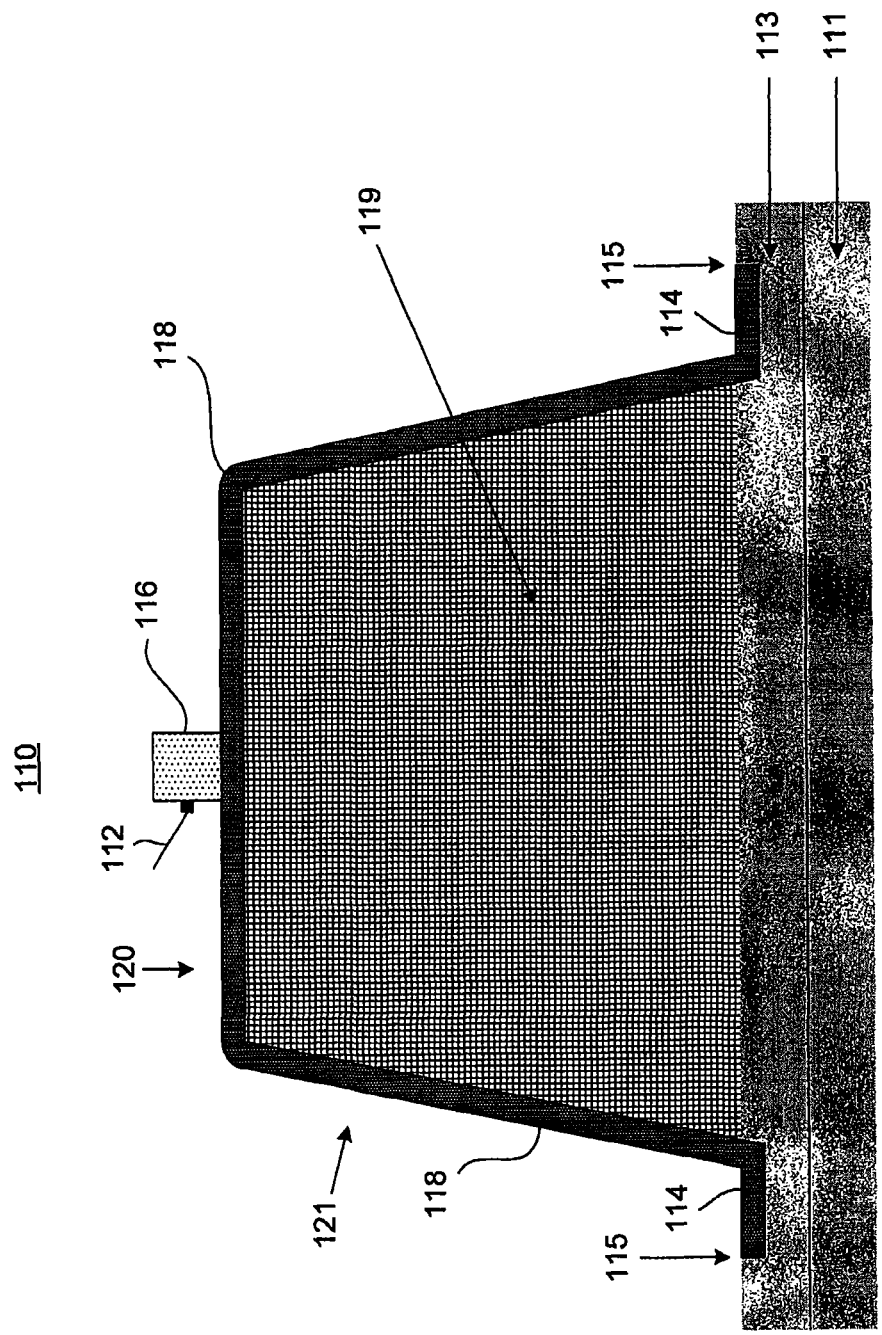
FIG. 32 is a cross sectional view of an embodiment of a mesa structure of a cap-doped SLS photodiode having the sidewalls passivated according to the invention.

FIG. 32 shows a cross-sectional view of an embodiment of a mesa structure of a cap-doped SLS photodiode or pixel 110 according to the invention. Photodiode 110 may be either n-p or p-n. The SLS structure 119 has a single carrier type, n-type or p-type. The SLS structure 119 may be a lightly doped photosensitive quantum confined detector material. The SLS structure 119 may be a lightly doped n-type SLS structure that allows photocarriers to diffuse vertically and laterally and are collected by the region 118 (i.e., cap junction).

The SLS structure 119 may be formed on a substrate 111 or a common contact 111 of like carrier type by epitaxial crystal growth techniques. An optional buffer layer 113 may be formed on the substrate 111 between the substrate 111 and the SLS layer 119. The buffer layer 113, if present, has the same carrier type as the substrate 111.

A doped region 118, formed along the sidewalls of the mesa structure, has a carrier type opposite that of the SLS structure 119. In one embodiment, the doped region 118 may be a diffused or implanted p-type region 118 that forms a wide bandgap quaternary material. An Ohmic contact 116 may be formed on the doped region 118. Alternatively, an Ohmic contact (not shown) may be formed on the substrate 111 within the doped region 118. Electrical connections 112 may be connected to the Ohmic contact.

A diode junction is created by doping a region 118 on the SLS structure 119 with a carrier type opposite that of the SLS structure 119. The doped region 118 may be formed according to techniques previously disclosed herein by diffusing or implanting ions of a carrier type opposite that of the SLS layer 119 to create a wide bandgap quaternary material in the resulting layer. In one embodiment, the doped region 118 may be extended to cover the base of the mesa structure, along portions 114 which do not extend to the similar portions of an adjacent diode, if any. In another embodiment, the doped region 118 extends across the top of the mesa 120 and at least partially along the side 121. Exposed portions 115 of the p-n junction create wide bandgap quaternary materials for lower leakage and ease of passivation.

The cap-doped architecture of photodiode 110 provides for the mesa structure many of the same advantages realized in lateral collection architectures of embodiments of the invention previously described. For example, exposed portions of the diode junction, such as those at locations 115, terminate in wide band gap material along the base of the mesa, resulting in lower leakage, good quantum efficiency, and ease of passivation. Another advantage over existing diode structures, such as photodiode 10, is an avoidance of the need for vertical transport of charge carriers through the single carrier-type structure 119, by allowing lateral collection to the junction on the mesa side wall. In addition, the cap-doped architecture may be particularly well suited for large area devices, and to those incorporating microlenses. The cap-doped architecture may also be well-suited for mid-wavelength infrared (MWIR) and long wavelength infrared (LWIR) applications, such as those currently addressed by HgCdTe technology.

In the cap-doped architecture, the doped sidewalls 118 of the mesa structure 110 have been rendered easy to passivate by using a process according to the invention that creates a heavily doped region 118 across the top of the mesa, and along at least part of the side of the mesa, and in some embodiments extending over and along the base of the mesa and whose region perimeter lies in wide-band gap material (such as 115).

Figure 33:
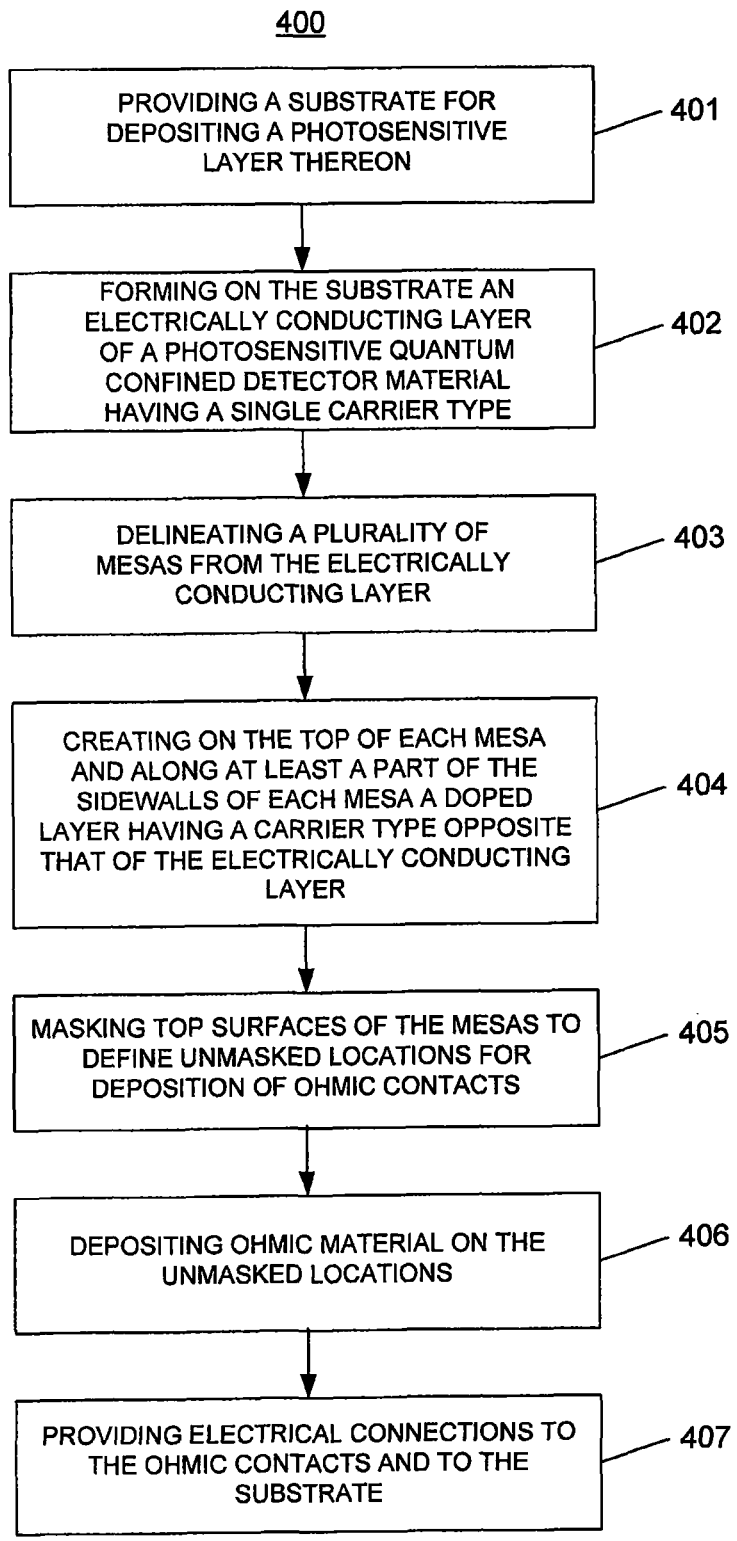
FIG. 33 is a process flow chart illustrating steps in a method according to the invention for fabricating a cap-doped SLS photodiode having wide bandgap sidewalls passivated.

FIG. 33 shows a process flow chart illustrating salient steps in a process 400 according to the invention for fabricating a cap-doped SLS photodetector pixel array having a wide bandgap passivation layer. The process begins at step 401, in which a substrate is provided that is suitable for depositing thereon a photosensitive layer structure. Next, in step 402, an electrically conducting layer of a photosensitive quantum confined detector material having a single carrier type is formed, for example, by deposition, on the substrate. The electrically conducting layer may be an SLS layer. Next, in step 403, a plurality of mesas is delineated from the electrically conducting layer to define a pixel array. This may be accomplished, for example, using an etching technique. In the next step 404, a doped layer having a carrier type opposite that of the electrically conducting layer, is created on the top of each mesa and along at least a part of the sidewalls of each mesa. This step may be accomplished using an ion implantation or diffusion technique with appropriate photolithographic masking. The converted layer may extend down the sidewall and along the base of each mesa. In the next step 405, the top surfaces of the mesas may be masked to define unmasked locations for deposition of Ohmic contacts on each of the pixels. Next, in step 406, Ohmic material may be deposited on the unmasked locations to create the Ohmic contacts. In a final step 407, electrical connections may be made to the Ohmic contacts, and to the substrate.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A method for fabricating a photodetector array having lateral collection architecture, comprising:
    providing a substrate suitable for depositing thereon one or more photosensitive layer structures;
    depositing on the substrate a first electrically conducting layer having a single carrier type;
    depositing on the first electrically conducting layer a second electrically conducting layer of a photosensitive quantum confined detector material having the same carrier type as the first electrically conducting layer;
    masking the second electrically conducting layer to locate unmasked regions for conversion;
    forming an anisotropic cavity in the second electrically conducting layer at the unmasked regions prior to diffusing a dopant into the anisotropic cavity;
    converting at least a portion of a surface and at least a portion of a near surface part of the unmasked regions to doped regions having a carrier type opposite that of the first and the second electrically conducting layers;
    masking the doped regions to define locations for deposition of first Ohmic contacts on each of the doped regions;
    depositing the first Ohmic contacts on the locations defined in the previous step; and
    providing electrical connections to the first Ohmic contacts, and to the first electrically conducting layer via a second Ohmic contact.

2. The method of claim 1 wherein the converting step comprises converting at least the portion of the surface and at least the portion of the near surface part of the unmasked regions by ion implantation.

3. The method of claim 1 wherein the converting step comprises converting at least the portion of the surface and at least the portion of the near surface part of the unmasked regions by diffusing a dopant into the second electrically conducting layer.

4. The method of claim 1 wherein the doped regions comprise a homogeneous quaternary.

5. A method for fabricating a photodetector or photodetector array, comprising:
   providing a substrate suitable for depositing thereon one or more photosensitive layer structures;
   depositing on the substrate a first electrically conducting layer having a single carrier type;
   depositing a second electrically conducting layer of a photosensitive quantum confined detector material, the second electrically conducting layer having the same carrier type as the first electrically conducting layer;
   depositing a third electrically conducting layer of a photosensitive quantum confined detector material, the third electrically conducting layer having a single carrier type of a type opposite the first electrically conducting layer;
   depositing a fourth electrically conducting layer having a wider bandgap than the third electrically conducting layer and having a same carrier type as the third electrically conducting layer;
   masking the fourth electrically conducting layer to locate pixels between unmasked regions;
   forming an anisotropic cavity in the second electrically conducting layer at the unmasked regions prior to diffusing a dopant into the anisotropic cavity;
   converting at least a portion of a surface and at least a portion of a near surface part of the unmasked regions to doped regions, each doped region having the carrier type of the first and the second electrically conducting layers to a depth penetrating to the second electrically conducting layer;
   masking the fourth electrically conducting layer to define locations for deposition of first Ohmic contacts on each of the pixels;
   depositing the first Ohmic contacts on surfaces of the pixels; and
   providing electrical connections to the first Ohmic contacts, and to the first electrically conducting layer via a second Ohmic contact.

6. The method of claim 5 wherein the converting step further comprises modifying chemical and, physical properties of the unmasked regions to create the pixels, each pixel formed from the third and the fourth electrically conducting layers and isolated from all other pixels by the doped regions and by the second electrically conducting layer.

7. The method of claim 5 wherein the third and the fourth electrically conducting layers comprise strained layer superlattice structures and wherein the converting step comprises disordering the superlattice structures to form a homogeneous quaternary.

8. The method of claim 7 further comprising disordering the superlattice structures by ion implantation.

9. The method of claim 5 wherein the anisotropic cavity is formed through the fourth electrically conducting layer at each of the unmasked regions, and the dopant is diffused into the anisotropic cavity.

10. The method of claim 5 wherein the forming step further comprises forming anisotropic cavities by plasma etching.

11. A method for fabricating a cap-doped photodetector pixel array having a wide bandgap passivation layer, comprising:
   providing a substrate suitable for depositing a photosensitive layer structure thereon;
   forming on the substrate an electrically conducting layer of a photosensitive quantum confined detector material having a single carrier type;
   delineating a plurality of mesas from the electrically conducting layer, the plurality of mesas extending into or through the photosensitive layer;
   converting a layer on top of each mesa and along at least a part of sidewalls of each mesa that extends at least through some distance along an exposed side of the photosensitive layer to a material having a carrier type opposite that of the electrically conducting layer, thereby enhancing lateral collection of minority carriers;
   masking top surfaces of the mesas to define unmasked locations for deposition of Ohmic contacts;
   depositing Ohmic material on the unmasked locations; and
   providing electrical connections to the Ohmic contacts and to the substrate.

12. The method of claim 11 wherein the converting step comprises ion implantation or diffusion.

13. The method of claim 11 wherein the converted layer extends along a base of each mesa.

14. The method of claim 11 wherein the converted layer is a quaternary formed separately or using the step of converting the layer on top of each mesa and along at least the part of sidewalls of each mesa.

15. A method for fabricating a photodetector or photodetector array, comprising:
   providing a substrate suitable for depositing thereon one or more photosensitive layer structures;
   depositing on the substrate a first electrically conducting layer having a single carrier type;
   depositing a second electrically conducting layer of a photosensitive quantum confined detector material, the second electrically conducting layer having the same carrier type as the first electrically conducting layer;
   depositing a third electrically conducting layer of a photosensitive quantum confined detector material, the third electrically conducting layer having a single carrier type of a type opposite the first electrically conducting layer wherein the third electrically conducting layer comprises a strained layer superlattice structure;
   depositing a fourth electrically conducting layer having a wider bandgap than the third electrically conducting layer and having a same carrier type as the third electrically conducting layer wherein the fourth electrically conducting layer comprises a strained layer superlattice structure;
   masking the fourth electrically conducting layer to locate pixels between unmasked regions;
   converting unmasked regions to doped regions, each doped region having the carrier type of the first and the second electrically conducting layers to a depth penetrating to the second electrically conducting layer;
   masking the fourth electrically conducting layer to define locations for deposition of first Ohmic contacts on each of the pixels;
   depositing the first Ohmic contacts on surfaces of the pixels; and
   providing electrical connections to the first Ohmic contacts, and to the first electrically conducting layer via a second Ohmic contact.

16. The method of claim 15 wherein the converting step further comprises modifying chemical and physical properties of the unmasked regions to create the pixels, each pixel formed from the third and the fourth electrically conducting layers and isolated from all other pixels by the doped regions and by the second electrically conducting layer.

17. The method of claim 15 further comprising disordering the superlattice structures to form a homogeneous quaternary.

18. The method of claim 15 further comprising forming an anisotropic cavity in the second electrically conducting layer at the unmasked regions prior to diffusing a dopant into the anisotropic cavity.

19. The method of claim 15 wherein the forming step further comprises forming anisotropic cavities by plasma etching.

* * * * *